United States Patent
Schaefer et al.

(10) Patent No.: US 11,675,662 B2
(45) Date of Patent: Jun. 13, 2023

(54) EXTENDED ERROR DETECTION FOR A MEMORY DEVICE

(71) Applicant: Micron Technology, Inc., Boise, ID (US)

(72) Inventors: Scott E. Schaefer, Boise, ID (US); Jongtae Kwak, Boise, ID (US); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 92 days.

(21) Appl. No.: 17/348,211

(22) Filed: Jun. 15, 2021

(65) Prior Publication Data
US 2021/0311829 A1 Oct. 7, 2021

Related U.S. Application Data

(63) Continuation of application No. 16/803,856, filed on Feb. 27, 2020, now Pat. No. 11,061,771.

(60) Provisional application No. 62/812,515, filed on Mar. 1, 2019.

(51) Int. Cl.
*G06F 11/10* (2006.01)
*G11C 7/10* (2006.01)

(52) U.S. Cl.
CPC ...... *G06F 11/1072* (2013.01); *G06F 11/1012* (2013.01); *G06F 11/1052* (2013.01); *G11C 7/1018* (2013.01)

(58) Field of Classification Search
CPC ............ G06F 11/1072; G06F 11/1012; G06F 11/1052; G11C 7/1018
See application file for complete search history.

(56) References Cited

U.S. PATENT DOCUMENTS

| | | | |
|---|---|---|---|
| 6,009,548 A | 12/1999 | Chen et al. | |
| 6,044,483 A | 3/2000 | Chen et al. | |
| 6,662,333 B1 | 12/2003 | Zhang et al. | |
| 6,799,287 B1 | 9/2004 | Sharma et al. | |
| 8,862,967 B2 * | 10/2014 | Pancholi ............. | H03M 13/258 714/760 |
| 9,450,609 B1 | 9/2016 | Schmit et al. | |

(Continued)

OTHER PUBLICATIONS

ISA/KR, International Search Report and Written Opinion of the International Searching Authority, Int'l. Appl. No. PCT/US2020/020679, dated Jun. 18, 2020, Korean Intellectual Property Office, Seo-gu, Daejeon, Republic of Korea, 11 pgs.

*Primary Examiner* — Kyle Vallecillo
(74) *Attorney, Agent, or Firm* — Holland & Hart LLP

(57) ABSTRACT

Methods, systems, and devices for extended error detection for a memory device are described. For example, during a read operation, the memory device may perform an error detection operation capable of detecting single-bit errors, double-bit errors, and errors that impact more than two bits and indicate the detected error to a host device. The memory device may use parity information to perform an error detection procedure to detect and/or correct errors within data retrieved during the read operation. In some cases, the memory device may associate each bit of the data read during the read operation with two or more bits of parity information. For example, the memory device may use two or more sets of parity bits to detect errors within a matrix of the data. Each set of parity bits may correspond to a dimension of the matrix of data.

17 Claims, 18 Drawing Sheets

(56) References Cited

U.S. PATENT DOCUMENTS

| | | |
|---|---|---|
| 2008/0313525 A1 | 12/2008 | Baker |
| 2009/0292968 A1 | 11/2009 | Cypher |
| 2015/0331745 A1 | 11/2015 | Zastrow |
| 2016/0188181 A1 | 6/2016 | Smith |
| 2017/0004035 A1 | 1/2017 | Suh et al. |
| 2017/0091025 A1 | 3/2017 | Ahn et al. |
| 2017/0132075 A1 | 5/2017 | Zastrow |
| 2017/0308433 A1 | 10/2017 | Kwon et al. |
| 2017/0329669 A1 | 11/2017 | Liu et al. |
| 2018/0004602 A1 | 1/2018 | Chih et al. |
| 2018/0039541 A1* | 2/2018 | Hahn .................. G06F 3/065 |
| 2018/0083653 A1 | 3/2018 | Khayat et al. |
| 2018/0152206 A1 | 5/2018 | Sin et al. |
| 2020/0218605 A1 | 7/2020 | Subramanian et al. |

* cited by examiner

|  | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Bits |
|---|---|---|---|---|---|---|---|---|---|---|---|---|---|---|---|---|---|
| ui 15 | D15 | D31 | D47 | D63 | D79 | D95 | D111 | D127 | D143 | D159 | D175 | D191 | D207 | D223 | D239 | D255 | 15 |
| ui 14 | D14 | D30 | D46 | D62 | D78 | D94 | D110 | D126 | D142 | D158 | D174 | D190 | D206 | D222 | D238 | D254 | 14 |
| ui 13 | D13 | D29 | D45 | D61 | D77 | D93 | D109 | D125 | D141 | D157 | D173 | D189 | D205 | D221 | D237 | D253 | 13 |
| ui 12 | D12 | D28 | D44 | D60 | D76 | D92 | D108 | D124 | D140 | D156 | D172 | D188 | D204 | D220 | D236 | D252 | 12 |
| ui 11 | D11 | D27 | D43 | D59 | D75 | D91 | D107 | D123 | D139 | D155 | D171 | D187 | D203 | D219 | D235 | D251 | 11 |
| ui 10 | D10 | D26 | D42 | D58 | D74 | D90 | D106 | D122 | D138 | D154 | D170 | D186 | D202 | D218 | D234 | D250 | 10 |
| ui 9 | D9 | D25 | D41 | D57 | D73 | D89 | D105 | D121 | D137 | D153 | D169 | D185 | D201 | D217 | D233 | D249 | 9 |
| ui 8 | D8 | D24 | D40 | D56 | D72 | D88 | D104 | D120 | D136 | D152 | D168 | D184 | D200 | D216 | D232 | D248 | 8 |
| ui 7 | D7 | D23 | D39 | D55 | D71 | D87 | D103 | D119 | D135 | D151 | D167 | D183 | D199 | D215 | D231 | D247 | 7 |
| ui 6 | D6 | D22 | D38 | D54 | D70 | D86 | D102 | D118 | D134 | D150 | D166 | D182 | D198 | D214 | D230 | D246 | 6 |
| ui 5 | D5 | D21 | D37 | D53 | D69 | D85 | D101 | D117 | D133 | D149 | D165 | D181 | D197 | D213 | D229 | D245 | 5 |
| ui 4 | D4 | D20 | D36 | D52 | D68 | D84 | D100 | D116 | D132 | D148 | D164 | D180 | D196 | D212 | D228 | D244 | 4 |
| ui 3 | D3 | D19 | D35 | D51 | D67 | D83 | D99 | D115 | D131 | D147 | D163 | D179 | D195 | D211 | D227 | D243 | 3 |
| ui 2 | D2 | D18 | D34 | D50 | D66 | D82 | D98 | D114 | D130 | D146 | D162 | D178 | D194 | D210 | D226 | D242 | 2 |
| ui 1 | D1 | D17 | D33 | D49 | D65 | D81 | D97 | D113 | D129 | D145 | D161 | D177 | D193 | D209 | D225 | D241 | 1 |
| ui 0 | D0 | D16 | D32 | D48 | D64 | D80 | D96 | D112 | D128 | D144 | D160 | D176 | D192 | D208 | D224 | D240 | 0 |
| Parity Bits | 0 | 1 | 2 | 3 | 4 | 5 | 6 | 7 | 8 | 9 | 10 | 11 | 12 | 13 | 14 | 15 | |

FIG. 4

| | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Bits | Parity Bits |
|---|---|---|---|---|---|---|---|---|---|---|---|---|---|---|---|---|---|---|
| ui 15 | D15 | D31 | D47 | D63 | D79 | D95 | D111 | D127 | D15 | D31 | D47 | D63 | D79 | D95 | D111 | D127 | 15 | 15 |
| ui 14 | D14 | D30 | D46 | D62 | D78 | D94 | D110 | D126 | D14 | D30 | D46 | D62 | D78 | D94 | D110 | D126 | 14 | 14 |
| ui 13 | D13 | D29 | D45 | D61 | D77 | D93 | D109 | D125 | D13 | D29 | D45 | D61 | D77 | D93 | D109 | D125 | 13 | 13 |
| ui 12 | D12 | D28 | D44 | D60 | D76 | D92 | D108 | D124 | D12 | D28 | D44 | D60 | D76 | D92 | D108 | D124 | 12 | 12 |
| ui 11 | D11 | D27 | D43 | D59 | D75 | D91 | D107 | D123 | D11 | D27 | D43 | D59 | D75 | D91 | D107 | D123 | 11 | 11 |
| ui 10 | D10 | D26 | D42 | D58 | D74 | D90 | D106 | D122 | D10 | D26 | D42 | D58 | D74 | D90 | D106 | D122 | 10 | 10 |
| ui 9 | D9 | D25 | D41 | D57 | D73 | D89 | D105 | D121 | D9 | D25 | D41 | D57 | D73 | D89 | D105 | D121 | 9 | 9 |
| ui 8 | D8 | D24 | D40 | D56 | D18 | D88 | D104 | D120 | D8 | D24 | D40 | D56 | D18 | D88 | D104 | D120 | 8 | 8 |
| ui 7 | D7 | D23 | D39 | D55 | D71 | D87 | D103 | D119 | D7 | D23 | D39 | D55 | D71 | D87 | D103 | D119 | 7 | 7 |
| ui 6 | D6 | D22 | D38 | D54 | D70 | D86 | D102 | D118 | D6 | D22 | D38 | D54 | D70 | D86 | D102 | D118 | 6 | 6 |
| ui 5 | D5 | D21 | D37 | D53 | D69 | D85 | D101 | D117 | D5 | D21 | D37 | D53 | D69 | D85 | D101 | D117 | 5 | 5 |
| ui 4 | D4 | D20 | D36 | D52 | D68 | D84 | D100 | D116 | D4 | D20 | D36 | D52 | D68 | D84 | D100 | D116 | 4 | 4 |
| ui 3 | D3 | D19 | D35 | D51 | D67 | D83 | D99 | D115 | D3 | D19 | D35 | D51 | D67 | D83 | D99 | D115 | 3 | 3 |
| ui 2 | D2 | D18 | D34 | D50 | D66 | D82 | D98 | D114 | D2 | D18 | D34 | D50 | D66 | D82 | D98 | D114 | 2 | 2 |
| ui 1 | D1 | D17 | D33 | D49 | D65 | D81 | D97 | D113 | D1 | D17 | D33 | D49 | D65 | D81 | D97 | D113 | 1 | 1 |
| ui 0 | D0 | D16 | D32 | D48 | D64 | D80 | D96 | D112 | D0 | D16 | D14 | D48 | D64 | D80 | D96 | D112 | 0 | 0 |
| Parity Bits | 0 | 1 | 2 | 3 | 4 | 5 | 6 | 7 | 8 | 9 | 10 | 11 | 12 | 13 | 14 | 15 | | |

FIG. 5

| | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Result |
|---|---|---|---|---|---|---|---|---|---|---|---|---|---|---|---|---|---|
| ui 15 | D15 | D31 | D47 | D63 | D79 | D95 | D111 | D127 | D143 | D159 | D175 | D191 | D207 | D223 | D239 | D255 | 0 |
| ui 14 | D14 | D30 | D46 | D62 | D78 | D94 | D110 | D126 | D142 | D158 | D174 | D190 | D206 | D222 | D238 | D254 | 1 |
| ui 13 | D13 | D29 | D45 | D61 | D77 | D93 | D109 | D125 | D141 | D157 | D173 | D189 | D205 | D221 | D237 | D253 | 0 |
| ui 12 | D12 | D28 | D44 | D60 | D76 | D92 | D108 | D124 | D140 | D156 | D172 | D188 | D204 | D220 | D236 | D252 | 0 |
| ui 11 | D11 | D27 | D43 | D59 | D75 | D91 | D107 | D123 | D139 | D155 | D171 | D187 | D203 | D219 | D235 | D251 | 0 |
| ui 10 | D10 | D26 | D42 | D58 | D74 | D90 | D106 | D122 | D138 | D154 | D170 | D186 | D202 | D218 | D234 | D250 | 0 |
| ui 9 | D9 | D25 | D41 | D57 | D73 | D89 | D105 | D121 | D137 | D153 | D169 | D185 | D201 | D217 | D233 | D249 | 0 |
| ui 8 | D8 | D24 | D40 | D56 | D72 | D88 | D104 | D120 | D136 | D152 | D168 | D184 | D200 | D216 | D232 | D248 | 0 |
| ui 7 | D7 | D23 | D39 | D55 | D71 | D87 | D103 | D119 | D135 | D151 | D167 | D183 | D199 | D215 | D231 | D247 | 0 |
| ui 6 | D6 | D22 | D38 | D54 | D70 | D86 | D102 | D118 | D134 | D150 | D166 | D182 | D198 | D214 | D230 | D246 | 0 |
| ui 5 | D5 | D21 | D37 | D53 | D69 | D85 | D101 | D117 | D133 | D149 | D165 | D181 | D197 | D213 | D229 | D245 | 0 |
| ui 4 | D4 | D20 | D36 | D52 | D68 | D84 | D100 | D116 | D132 | D148 | D164 | D180 | D196 | D212 | D228 | D244 | 0 |
| ui 3 | D3 | D19 | D35 | D51 | D67 | D83 | D99 | D115 | D131 | D147 | D163 | D179 | D195 | D211 | D227 | D243 | 0 |
| ui 2 | D2 | D18 | D34 | D50 | D66 | D82 | D98 | D114 | D130 | D146 | D162 | D178 | D194 | D210 | D226 | D242 | 0 |
| ui 1 | D1 | D17 | D33 | D49 | D65 | D81 | D97 | D113 | D129 | D145 | D161 | D177 | D193 | D209 | D225 | D241 | 0 |
| ui 0 | D0 | D16 | D32 | D48 | D64 | D80 | D96 | D112 | D128 | D144 | D160 | D176 | D192 | D208 | D224 | D240 | 0 |
| Parity Result | 0 | 1 | 0 | 0 | 0 | 0 | 0 | 0 | 0 | 0 | 0 | 0 | 0 | 0 | 0 | 0 | |

▓ Corrected Data

FIG. 6

| | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Result |
|---|---|---|---|---|---|---|---|---|---|---|---|---|---|---|---|---|---|
| ui 15 | D15 | D31 | D47 | D63 | D79 | D95 | D111 | D127 | D143 | D159 | D175 | D191 | D207 | D223 | D239 | D255 | 0 |
| ui 14 | D14 | D30 | D46 | D62 | D78 | D94 | D110 | D126 | D142 | D158 | D174 | D190 | D206 | D222 | D238 | D254 | 1 |
| ui 13 | D13 | D29 | D45 | D61 | D77 | D93 | D109 | D125 | D141 | D157 | D173 | D189 | D205 | D221 | D237 | D253 | 0 |
| ui 12 | D12 | D28 | D44 | D60 | D76 | D92 | D108 | D124 | D140 | D156 | D172 | D188 | D204 | D220 | D236 | D252 | 0 |
| ui 11 | D11 | D27 | D43 | D59 | D75 | D91 | D107 | D123 | D139 | D155 | D171 | D187 | D203 | D219 | D235 | D251 | 0 |
| ui 10 | D10 | D26 | D42 | D58 | D74 | D90 | D106 | D122 | D138 | D154 | D170 | D186 | D202 | D218 | D234 | D250 | 0 |
| ui 9 | D9 | D25 | D41 | D57 | D73 | D89 | D105 | D121 | D137 | D153 | D169 | D185 | D201 | D217 | D233 | D249 | 0 |
| ui 8 | D8 | D24 | D40 | D56 | D72 | D88 | D104 | D120 | D136 | D152 | D168 | D184 | D200 | D216 | D232 | D248 | 0 |
| ui 7 | D7 | D23 | D39 | D55 | D71 | D87 | D103 | D119 | D135 | D151 | D167 | D183 | D199 | D215 | D231 | D247 | 0 |
| ui 6 | D6 | D22 | D38 | D54 | D70 | D86 | D102 | D118 | D134 | D150 | D166 | D182 | D198 | D214 | D230 | D246 | 0 |
| ui 5 | D5 | D21 | D37 | D53 | D69 | D85 | D101 | D117 | D133 | D149 | D165 | D181 | D197 | D213 | D229 | D245 | 0 |
| ui 4 | D4 | D20 | D36 | D52 | D68 | D84 | D100 | D116 | D132 | D148 | D164 | D180 | D196 | D212 | D228 | D244 | 0 |
| ui 3 | D3 | D19 | D35 | D51 | D67 | D83 | D99 | D115 | D131 | D147 | D163 | D179 | D195 | D211 | D227 | D243 | 0 |
| ui 2 | D2 | D18 | D34 | D50 | D66 | D82 | D98 | D114 | D130 | D146 | D162 | D178 | D194 | D210 | D226 | D242 | 0 |
| ui 1 | D1 | D17 | D33 | D49 | D65 | D81 | D97 | D113 | D129 | D145 | D161 | D177 | D193 | D209 | D225 | D241 | 0 |
| ui 0 | D0 | D16 | D32 | D48 | D64 | D80 | D96 | D112 | D128 | D144 | D160 | D176 | D192 | D208 | D224 | D240 | 0 |
| Parity Result | 0 | 1 | 0 | 0 | 0 | 0 | 0 | 0 | 0 | 0 | 0 | 0 | 0 | 0 | 0 | 0 | |

FIG. 7

| | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Result |
|---|---|---|---|---|---|---|---|---|---|---|---|---|---|---|---|---|---|
| ui 15 | D15 | D31 | D47 | D63 | D79 | D95 | D111 | D127 | D143 | D159 | D175 | D191 | D207 | D223 | D239 | D255 | 0 |
| ui 14 | D14 | D30 | D46 | D62 | D78 | D94 | D110 | D126 | D142 | D158 | D174 | D190 | D206 | D222 | D238 | D254 | 1 |
| ui 13 | D13 | D29 | D45 | D61 | D77 | D93 | D109 | D125 | D141 | D157 | D173 | D189 | D205 | D221 | D237 | D253 | 1 |
| ui 12 | D12 | D28 | D44 | D60 | D76 | D92 | D108 | D124 | D140 | D156 | D172 | D188 | D204 | D220 | D236 | D252 | 0 |
| ui 11 | D11 | D27 | D43 | D59 | D75 | D91 | D107 | D123 | D139 | D155 | D171 | D187 | D203 | D219 | D235 | D251 | 0 |
| ui 10 | D10 | D26 | D42 | D58 | D74 | D90 | D106 | D122 | D138 | D154 | D170 | D186 | D202 | D218 | D234 | D250 | 0 |
| ui 9 | D9 | D25 | D41 | D57 | D73 | D89 | D105 | D121 | D137 | D153 | D169 | D185 | D201 | D217 | D233 | D249 | 0 |
| ui 8 | D8 | D24 | D40 | D56 | D18 | D88 | D104 | D120 | D136 | D152 | D168 | D184 | D200 | D216 | D232 | D248 | 0 |
| ui 7 | D7 | D23 | D39 | D55 | D71 | D87 | D103 | D119 | D135 | D151 | D167 | D183 | D199 | D215 | D231 | D247 | 0 |
| ui 6 | D6 | D22 | D38 | D54 | D70 | D86 | D102 | D118 | D134 | D150 | D166 | D182 | D198 | D214 | D230 | D246 | 0 |
| ui 5 | D5 | D21 | D37 | D53 | D69 | D85 | D101 | D117 | D133 | D149 | D165 | D181 | D197 | D213 | D229 | D245 | 0 |
| ui 4 | D4 | D20 | D36 | D52 | D68 | D84 | D100 | D116 | D132 | D148 | D164 | D180 | D196 | D212 | D228 | D244 | 0 |
| ui 3 | D3 | D19 | D35 | D51 | D67 | D83 | D99 | D115 | D131 | D147 | D163 | D179 | D195 | D211 | D227 | D243 | 0 |
| ui 2 | D2 | D18 | D34 | D50 | D66 | D82 | D98 | D114 | D130 | D146 | D162 | D178 | D194 | D210 | D226 | D242 | 0 |
| ui 1 | D1 | D17 | D33 | D49 | D65 | D81 | D97 | D113 | D129 | D145 | D161 | D177 | D193 | D209 | D225 | D241 | 0 |
| ui 0 | D0 | D16 | D32 | D48 | D64 | D80 | D96 | D112 | D128 | D144 | D160 | D176 | D192 | D208 | D224 | D240 | 0 |
| Parity Result | 0 | 0 | 0 | 0 | 0 | 0 | 0 | 0 | 0 | 0 | 0 | 0 | 0 | 0 | 0 | 0 | |

FIG. 8

|        | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Result |
|---|---|---|---|---|---|---|---|---|---|---|---|---|---|---|---|---|---|
| ui 15 | D15 | D31 | D47 | D63 | D79 | D95 | D111 | D127 | D143 | D159 | D175 | D191 | D207 | D223 | D239 | D255 | 1 |
| ui 14 | D14 | D30 | D46 | D62 | D78 | D94 | D110 | D126 | D142 | D158 | D174 | D190 | D206 | D222 | D238 | D254 | 1 |
| ui 13 | D13 | D29 | D45 | D61 | D77 | D93 | D109 | D125 | D141 | D157 | D173 | D189 | D205 | D221 | D237 | D253 | 0 |
| ui 12 | D12 | D28 | D44 | D60 | D76 | D92 | D108 | D124 | D140 | D156 | D172 | D188 | D204 | D220 | D236 | D252 | 0 |
| ui 11 | D11 | D27 | D43 | D59 | D75 | D91 | D107 | D123 | D139 | D155 | D171 | D187 | D203 | D219 | D235 | D251 | 0 |
| ui 10 | D10 | D26 | D42 | D58 | D74 | D90 | D106 | D122 | D138 | D154 | D170 | D186 | D202 | D218 | D234 | D250 | 0 |
| ui 9 | D9 | D25 | D41 | D57 | D73 | D89 | D105 | D121 | D137 | D153 | D169 | D185 | D201 | D217 | D233 | D249 | 0 |
| ui 8 | D8 | D24 | D40 | D56 | D74 | D88 | D104 | D120 | D136 | D152 | D168 | D184 | D200 | D216 | D232 | D248 | 0 |
| ui 7 | D7 | D23 | D39 | D55 | D71 | D87 | D103 | D119 | D135 | D151 | D167 | D183 | D199 | D215 | D231 | D247 | 0 |
| ui 6 | D6 | D22 | D38 | D54 | D70 | D86 | D102 | D118 | D134 | D150 | D166 | D182 | D198 | D214 | D230 | D246 | 0 |
| ui 5 | D5 | D21 | D37 | D53 | D69 | D85 | D101 | D117 | D133 | D149 | D165 | D181 | D197 | D213 | D229 | D245 | 0 |
| ui 4 | D4 | D20 | D36 | D52 | D68 | D84 | D100 | D116 | D132 | D148 | D164 | D180 | D196 | D212 | D228 | D244 | 0 |
| ui 3 | D3 | D19 | D35 | D51 | D67 | D83 | D99 | D115 | D131 | D147 | D163 | D179 | D195 | D211 | D227 | D243 | 0 |
| ui 2 | D2 | D18 | D34 | D50 | D66 | D82 | D98 | D114 | D130 | D146 | D162 | D178 | D194 | D210 | D226 | D242 | 0 |
| ui 1 | D1 | D17 | D33 | D49 | D65 | D81 | D97 | D113 | D129 | D145 | D161 | D177 | D193 | D209 | D225 | D241 | 0 |
| ui 0 | D0 | D16 | D32 | D48 | D64 | D80 | D96 | D112 | D128 | D144 | D160 | D176 | D192 | D208 | D224 | D240 | 0 |
| Parity Result | 1 | 1 | 0 | 0 | 0 | 0 | 0 | 0 | 0 | 0 | 0 | 0 | 0 | 0 | 0 | 0 | |

Error ▓  Detected Error ░

FIG. 9

| | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Result |
|---|---|---|---|---|---|---|---|---|---|---|---|---|---|---|---|---|---|
| ui 15 | D15 | D31 | D47 | D63 | D79 | D95 | D111 | D127 | D143 | D159 | D175 | D191 | D207 | D223 | D239 | D255 | 1 |
| ui 14 | D14 | D30 | D46 | D62 | D78 | D94 | D110 | D126 | D142 | D158 | D174 | D190 | D206 | D222 | D238 | D254 | 0 |
| ui 13 | D13 | D29 | D45 | D61 | D77 | D93 | D109 | D125 | D141 | D157 | D173 | D189 | D205 | D221 | D237 | D253 | 0 |
| ui 12 | D12 | D28 | D44 | D60 | D76 | D92 | D108 | D124 | D140 | D156 | D172 | D188 | D204 | D220 | D236 | D252 | 0 |
| ui 11 | D11 | D27 | D43 | D59 | D75 | D91 | D107 | D123 | D139 | D155 | D171 | D187 | D203 | D219 | D235 | D251 | 0 |
| ui 10 | D10 | D26 | D42 | D58 | D74 | D90 | D106 | D122 | D138 | D154 | D170 | D186 | D202 | D218 | D234 | D250 | 0 |
| ui 9 | D9 | D25 | D41 | D57 | D73 | D89 | D105 | D121 | D137 | D153 | D169 | D185 | D201 | D217 | D233 | D249 | 0 |
| ui 8 | D8 | D24 | D40 | D56 | D18 | D88 | D104 | D120 | D136 | D152 | D168 | D184 | D200 | D216 | D232 | D248 | 0 |
| ui 7 | D7 | D23 | D39 | D55 | D71 | D87 | D103 | D119 | D135 | D151 | D167 | D183 | D199 | D215 | D231 | D247 | 0 |
| ui 6 | D6 | D22 | D38 | D54 | D70 | D86 | D102 | D118 | D134 | D150 | D166 | D182 | D198 | D214 | D230 | D246 | 0 |
| ui 5 | D5 | D21 | D37 | D53 | D69 | D85 | D101 | D117 | D133 | D149 | D165 | D181 | D197 | D213 | D229 | D245 | 0 |
| ui 4 | D4 | D20 | D36 | D52 | D68 | D84 | D100 | D116 | D132 | D148 | D164 | D180 | D196 | D212 | D228 | D244 | 0 |
| ui 3 | D3 | D19 | D35 | D51 | D67 | D83 | D99 | D115 | D131 | D147 | D163 | D179 | D195 | D211 | D227 | D243 | 0 |
| ui 2 | D2 | D18 | D34 | D50 | D66 | D82 | D98 | D114 | D130 | D146 | D162 | D178 | D194 | D210 | D226 | D242 | 0 |
| ui 1 | D1 | D17 | D33 | D49 | D65 | D81 | D97 | D113 | D129 | D145 | D161 | D177 | D193 | D209 | D225 | D241 | 0 |
| ui 0 | D0 | D16 | D32 | D48 | D64 | D80 | D96 | D112 | D128 | D144 | D160 | D176 | D192 | D208 | D224 | D240 | 0 |
| Parity Result | 1 | 1 | 1 | 0 | 0 | 0 | 0 | 0 | 0 | 0 | 0 | 0 | 0 | 0 | 0 | 0 | |

Corrected Data
Detected Error

FIG. 10

| | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Result |
|---|---|---|---|---|---|---|---|---|---|---|---|---|---|---|---|---|---|
| ui 15 | D15 | D31 | D47 | D63 | D79 | D95 | D111 | D127 | D143 | D159 | D175 | D191 | D207 | D223 | D239 | D255 | 0 |
| ui 14 | D14 | D30 | D46 | D62 | D78 | D94 | D110 | D126 | D142 | D158 | D174 | D190 | D206 | D222 | D238 | D254 | 0 |
| ui 13 | D13 | D29 | D45 | D61 | D77 | D93 | D109 | D125 | D141 | D157 | D173 | D189 | D205 | D221 | D237 | D253 | 0 |
| ui 12 | D12 | D28 | D44 | D60 | D76 | D92 | D108 | D124 | D140 | D156 | D172 | D188 | D204 | D220 | D236 | D252 | 0 |
| ui 11 | D11 | D27 | D43 | D59 | D75 | D91 | D107 | D123 | D139 | D155 | D171 | D187 | D203 | D219 | D235 | D251 | 0 |
| ui 10 | D10 | D26 | D42 | D58 | D73 | D90 | D106 | D122 | D138 | D154 | D170 | D186 | D202 | D218 | D234 | D250 | 0 |
| ui 9 | D9 | D25 | D41 | D57 | D74 | D89 | D105 | D121 | D137 | D153 | D169 | D185 | D201 | D217 | D233 | D249 | 0 |
| ui 8 | D8 | D24 | D40 | D56 | D18 | D88 | D104 | D120 | D136 | D152 | D168 | D184 | D200 | D216 | D232 | D248 | 0 |
| ui 7 | D7 | D23 | D39 | D55 | D71 | D87 | D103 | D119 | D135 | D151 | D167 | D183 | D199 | D215 | D231 | D247 | 0 |
| ui 6 | D6 | D22 | D38 | D54 | D70 | D86 | D102 | D118 | D134 | D150 | D166 | D182 | D198 | D214 | D230 | D246 | 0 |
| ui 5 | D5 | D21 | D37 | D53 | D69 | D85 | D101 | D117 | D133 | D149 | D165 | D181 | D197 | D213 | D229 | D245 | 0 |
| ui 4 | D4 | D20 | D36 | D52 | D68 | D84 | D100 | D116 | D132 | D148 | D164 | D180 | D196 | D212 | D228 | D244 | 0 |
| ui 3 | D3 | D19 | D35 | D51 | D67 | D83 | D99 | D115 | D131 | D147 | D163 | D179 | D195 | D211 | D227 | D243 | 0 |
| ui 2 | D2 | D18 | D34 | D50 | D66 | D82 | D98 | D114 | D130 | D146 | D162 | D178 | D194 | D210 | D226 | D242 | 0 |
| ui 1 | D1 | D17 | D33 | D49 | D65 | D81 | D97 | D113 | D129 | D145 | D161 | D177 | D193 | D209 | D225 | D241 | 0 |
| ui 0 | D0 | D16 | D32 | D48 | D64 | D80 | D96 | D112 | D128 | D144 | D160 | D176 | D192 | D208 | D224 | D240 | 0 |
| Parity Result | 0 | 0 | 0 | 0 | 0 | 0 | 0 | 0 | 0 | 0 | 0 | 0 | 0 | 0 | 0 | 0 | |

Error

| | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Result |
|---|---|---|---|---|---|---|---|---|---|---|---|---|---|---|---|---|---|
| ui 15 | D15 | D31 | D47 | D63 | D79 | D95 | D111 | D127 | D143 | D159 | D175 | D191 | D207 | D223 | D239 | D255 | 1 |
| ui 14 | D14 | D30 | D46 | D62 | D78 | D94 | D110 | D126 | D142 | D158 | D174 | D190 | D206 | D222 | D238 | D254 | 1 |
| ui 13 | D13 | D29 | D45 | D61 | D77 | D93 | D109 | D125 | D141 | D157 | D173 | D189 | D205 | D221 | D237 | D253 | 1 |
| ui 12 | D12 | D28 | D44 | D60 | D76 | D92 | D108 | D124 | D140 | D156 | D172 | D188 | D204 | D220 | D236 | D252 | 1 |
| ui 11 | D11 | D27 | D43 | D59 | D75 | D91 | D107 | D123 | D139 | D155 | D171 | D187 | D203 | D219 | D235 | D251 | 1 |
| ui 10 | D10 | D26 | D42 | D58 | D73 | D90 | D106 | D122 | D138 | D154 | D170 | D186 | D202 | D218 | D234 | D250 | 1 |
| ui 9 | D9 | D25 | D41 | D57 | D74 | D89 | D105 | D121 | D137 | D153 | D169 | D185 | D201 | D217 | D233 | D249 | 1 |
| ui 8 | D8 | D24 | D40 | D56 | D18 | D88 | D104 | D120 | D136 | D152 | D168 | D184 | D200 | D216 | D232 | D248 | 1 |
| ui 7 | D7 | D23 | D39 | D55 | D71 | D87 | D103 | D119 | D135 | D151 | D167 | D183 | D199 | D215 | D231 | D247 | 1 |
| ui 6 | D6 | D22 | D38 | D54 | D70 | D86 | D102 | D118 | D134 | D150 | D166 | D182 | D198 | D214 | D230 | D246 | 1 |
| ui 5 | D5 | D21 | D37 | D53 | D69 | D85 | D101 | D117 | D133 | D149 | D165 | D181 | D197 | D213 | D229 | D245 | 1 |
| ui 4 | D4 | D20 | D36 | D52 | D68 | D84 | D100 | D116 | D132 | D148 | D164 | D180 | D196 | D212 | D228 | D244 | 1 |
| ui 3 | D3 | D19 | D35 | D51 | D67 | D83 | D99 | D115 | D131 | D147 | D163 | D179 | D195 | D211 | D227 | D243 | 1 |
| ui 2 | D2 | D18 | D34 | D40 | D66 | D82 | D98 | D114 | D130 | D146 | D162 | D178 | D194 | D210 | D226 | D242 | 1 |
| ui 1 | D1 | D17 | D33 | D49 | D65 | D81 | D97 | D113 | D129 | D145 | D161 | D177 | D193 | D209 | D225 | D241 | 1 |
| ui 0 | D0 | D16 | D32 | D48 | D64 | D80 | D96 | D112 | D128 | D144 | D160 | D176 | D192 | D208 | D224 | D240 | 1 |
| Parity Result | 0 | 0 | 0 | 0 | 0 | 0 | 0 | 0 | 0 | 0 | 0 | 0 | 0 | 0 | 0 | 0 | |

■ Error

| | DQ0 | DQ1 | DQ2 | DQ3 | DQ4 | DQ5 | DQ6 | DQ7 | DQ8 | DQ9 | DQ10 | DQ11 | DQ12 | DQ13 | DQ14 | DQ15 | Parity Result |
|---|---|---|---|---|---|---|---|---|---|---|---|---|---|---|---|---|---|
| ui 15 | D15 | D31 | D47 | D63 | D79 | D95 | D111 | D127 | D143 | D159 | D175 | D191 | D207 | D223 | D239 | D255 | 0 |
| ui 14 | D14 | D30 | D46 | D62 | D78 | D94 | D110 | D126 | D142 | D158 | D174 | D190 | D206 | D222 | D238 | D254 | 0 |
| ui 13 | D13 | D29 | D45 | D61 | D77 | D93 | D109 | D125 | D141 | D157 | D173 | D189 | D205 | D221 | D237 | D253 | 0 |
| ui 12 | D12 | D28 | D44 | D60 | D76 | D92 | D108 | D124 | D140 | D156 | D172 | D188 | D204 | D220 | D236 | D252 | 0 |
| ui 11 | D11 | D27 | D43 | D59 | D75 | D91 | D107 | D123 | D139 | D155 | D171 | D187 | D203 | D219 | D235 | D251 | 0 |
| ui 10 | D10 | D26 | D42 | D58 | D74 | D90 | D106 | D122 | D138 | D154 | D170 | D186 | D202 | D218 | D234 | D250 | 0 |
| ui 9 | D9 | D25 | D41 | D57 | D73 | D89 | D105 | D121 | D137 | D153 | D169 | D185 | D201 | D217 | D233 | D249 | 0 |
| ui 8 | D8 | D24 | D40 | D56 | D74 | D88 | D104 | D120 | D136 | D152 | D168 | D184 | D200 | D216 | D232 | D248 | 0 |
| ui 7 | D7 | D23 | D39 | D55 | D71 | D87 | D103 | D119 | D135 | D151 | D167 | D183 | D199 | D215 | D231 | D247 | 0 |
| ui 6 | D6 | D22 | D38 | D54 | D70 | D86 | D102 | D118 | D134 | D150 | D166 | D182 | D198 | D214 | D230 | D246 | 0 |
| ui 5 | D5 | D21 | D37 | D53 | D69 | D85 | D101 | D117 | D133 | D149 | D165 | D181 | D197 | D213 | D229 | D245 | 0 |
| ui 4 | D4 | D20 | D36 | D52 | D68 | D84 | D100 | D116 | D132 | D148 | D164 | D180 | D196 | D212 | D228 | D244 | 0 |
| ui 3 | D3 | D19 | D35 | D51 | D67 | D83 | D99 | D115 | D131 | D147 | D163 | D179 | D195 | D211 | D227 | D243 | 0 |
| ui 2 | D2 | D18 | D34 | D50 | D66 | D82 | D98 | D114 | D120 | D146 | D162 | D178 | D194 | D210 | D226 | D242 | 0 |
| ui 1 | D1 | D17 | D33 | D49 | D65 | D81 | D97 | D113 | D129 | D145 | D161 | D177 | D193 | D209 | D225 | D241 | 0 |
| ui 0 | D0 | D16 | D32 | D48 | D64 | D80 | D96 | D112 | D128 | D144 | D160 | D176 | D192 | D208 | D224 | D240 | 0 |
| Parity Result | 1 | 1 | 1 | 1 | 1 | 1 | 1 | 1 | 1 | 1 | 1 | 1 | 1 | 1 | 1 | 1 | |

FIG. 14

EXTENDED ERROR DETECTION FOR A MEMORY DEVICE

CROSS REFERENCE

The present application for patent is a continuation of of U.S. patent application Ser. No. 16/803,856, by SCHAEFER et al., entitled "EXTENDED ERROR DETECTION FOR A MEMORY DEVICE," filed Feb. 27, 2020, which claims the benefit of U.S. Provisional Patent Application No. 62/812,515, by SCHAEFER et al., entitled "EXTENDED ERROR DETECTION FOR A MEMORY DEVICE," filed Mar. 1, 2019, assigned to the assignee hereof, and each of which is expressly incorporated by reference herein.

BACKGROUND

The following relates generally to a system that includes at least one memory device and more specifically to extended error detection for a memory device.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

In some cases, data stored within a memory device may become corrupted. Some memory devices may be configured to internally detect and/or correct such data corruption or errors (e.g., data errors) and thereby recover the data as stored before corruption. Improved techniques for reporting such detection and/or correction may be desired. Improving memory devices, generally, may include increasing memory cell density, increasing read/write speeds, increasing reliability, increasing data integrity, reducing power consumption, or reducing manufacturing costs, among other metrics.

BRIEF DESCRIPTION OF THE DRAWINGS

FIGS. 4 through 14 illustrate examples data matrices that support extended error detection for a memory device in accordance with examples as disclosed herein.

DETAILED DESCRIPTION

Figure 1:
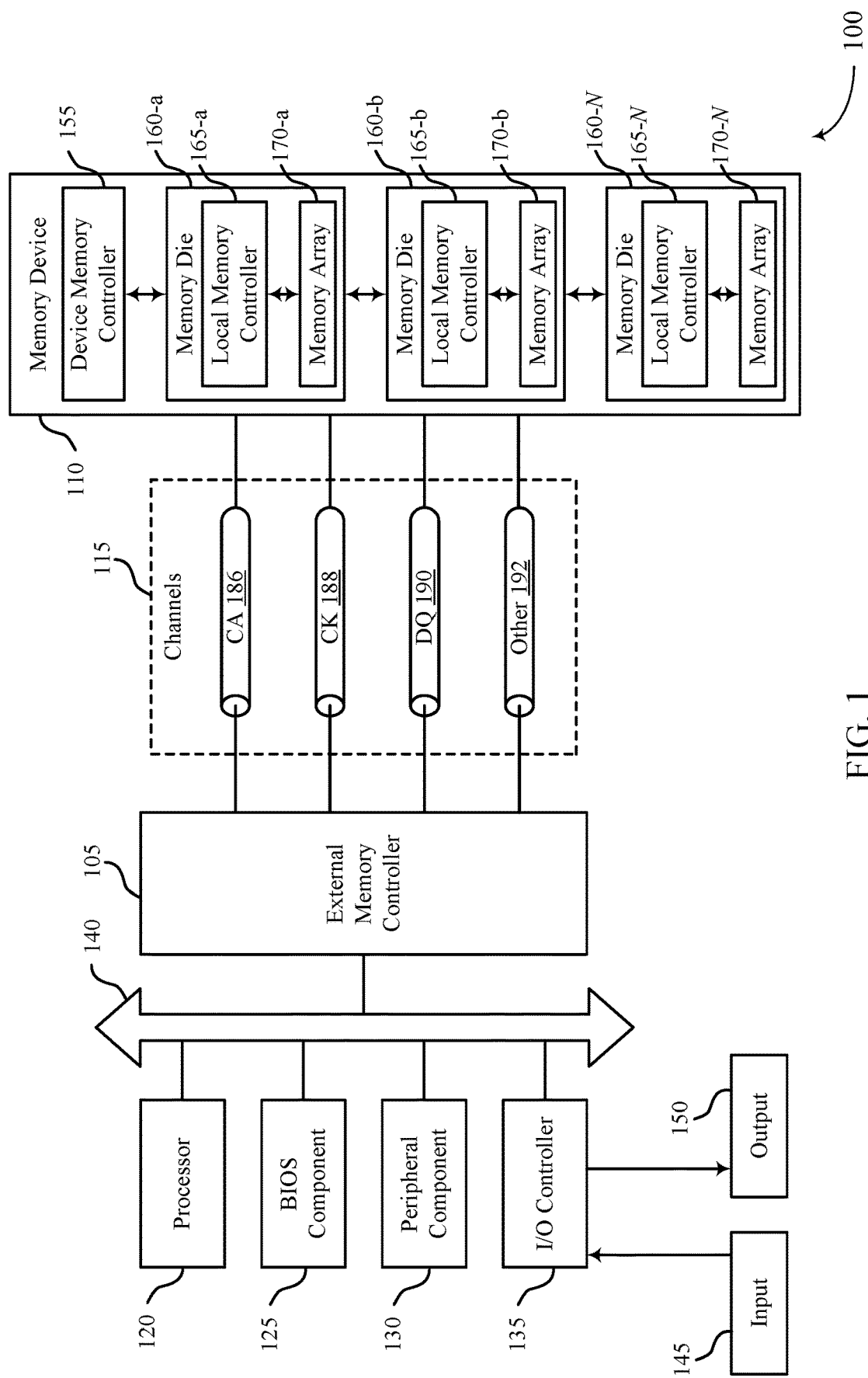
FIG. 1 illustrates an example of a system that supports extended error detection for a memory device in accordance with examples as disclosed herein.

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., DRAM) for some applications may be expected to operate with a reliability subject to relatively higher industry standards or specifications (e.g., higher reliability constraints).

Data stored in a memory device may in some cases become corrupted (e.g., due to leakage, parasitic coupling, or electromagnetic interference (EMI)). Corruption of data may refer to an unintentional change in the logic value of data as stored within the memory device and thus may refer to an unintended change in the logic value stored by one or more memory cells (e.g., from a logic one (1) to a logic zero (0), or vice versa). For example, a memory device may perform a read operation to determine the logic value of data stored within the memory device and one or more of the memory cells may have become corrupted. A deviation in the stored logic value of a bit from its original and intended logic value may be referred as an error, a bit error, or a data error and may result from corruption. Some memory devices may be configured to internally detect and in at least some cases correct (repair) such data corruption or errors and thereby recover the data as stored before corruption. Such error detection and correction may rely upon one or more error-correcting codes (ECCs) (e.g., parity codes, block codes, convolutional codes, Hamming codes, low-density parity-check (LDPC) codes, turbo codes, polar codes), and related processes, operations, and techniques which may be referred to as ECC processes, ECC operations, ECC techniques, or in some cases as simply ECC. Error detection and correction conducted internally within a memory device on data stored previously at the memory device may generally be referred to as in-line ECC (whether within a single-die memory device or a multi-die memory device), and memory devices that support on-die ECC may be referred to as ECC memory.

During the execution of a read operation, a memory device with ECC memory may perform an error correction operation on data read from a memory array according to the read operation. For example, the memory device may perform a single error correction (SEC) procedure or a single error correction double error detection (SECDED) procedure. An SEC procedure may detect the occurrence of a single bit error (one bit in the data is corrupted) and correct the single bit error (determine the original, uncorrupted value of the data and perform one or more subsequent operations or output the corrected data). In some cases, however, (e.g., in the event of two or more bit errors) a SEC procedure may increase a quantity of bit errors within the data by accidentally changing an uncorrupted bit. A SECDED procedure may detect the occurrence of both single bit errors and even-bit errors as well as correct the detected single bit errors. But both SEC procedures and SECDED procedures fail to correct bit errors impacting more than one bit or detect odd-bit errors impacting more than one bit. It may be desirable for the memory device to detect or correct other errors (e.g., impacting more than one bit). This may increase the reliability of the memory device.

Techniques for extended error detection for a memory device (e.g., on-die ECC) are described. The memory device may perform an error detection operation that detects single-bit errors, double-bit errors, and errors that impact more than two bits and indicate the detected error to a host device. The memory device may use parity information to perform an error detection procedure to detect and/or correct errors within data retrieved during the read operation. In some cases, the memory device may associate each bit of the data read during the read operation with two bits of parity information. For example, the memory device may use two or more sets of parity bits to detect errors within a matrix of the data. Each set of parity bits may correspond to a dimension of the matrix of data. Thus, each bit of the data within the matrix may be associated with two or more parity bits corresponding to the parity dimensions.

Features of the disclosure are initially described in the context of a memory system and memory die as described with reference to FIGS. 1-3. Features of the disclosure are further described below in the context of data matrices and a process flow as described with reference to FIGS. 4-15. These and other features of the disclosure are further illustrated by and described with reference to an apparatus diagram and flowcharts that relate to extended error detection for a memory device as described with references to FIGS. 16-18.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 is configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-$a$, local memory controller 165-$b$, and/or local memory controller 165-N) and a memory array 170 (e.g., memory array 170-$a$, memory array 170-$b$, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-$a$, memory die 160-$b$, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. In some cases, the channels 115 may include one or more other channels 192 that may be dedicated to other purposes. These other channels 192 may include any quantity of signal paths.

In some cases, the other channels 192 may include an indicator of detected and/or corrected errors associated with data of a read operation. The memory device 110 may perform an error detection operation on the data read from a memory array 170. The error detection operation may detect single-bit errors, double-bit errors, and errors that impact more than two bits. The memory device 110 may use parity information to perform the error detection procedure to detect and/or correct errors within data retrieved from the memory array 170 during the read operation. In some cases, the memory device 110 may associate each bit of the data read during the read operation with two or more bits of parity information. For example, the memory device 110 may use two or more sets of parity bits to detect errors within a matrix of the data. Each set of parity bits may correspond to a dimension of the matrix of data. Thus, each bit of the data within the matrix may be associated with two or more parity bits corresponding to the parity dimensions. The memory device 110 may output an indicator of the detected and/or corrected error by the other channels 192. The indicator may include a flag indicating a detected error. Additionally or alternatively, the indicator may include an indication of a type of error detected or corrected within the data read from the memory array 170. In some other cases, the indicator may be communicated over the DQ channels 190. Here, the external memory controller 105 and/or the memory device 110 may adjust the burst length of a burst of data to include both the data associated with the access operation and the indicator of the detected error associated with the data.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
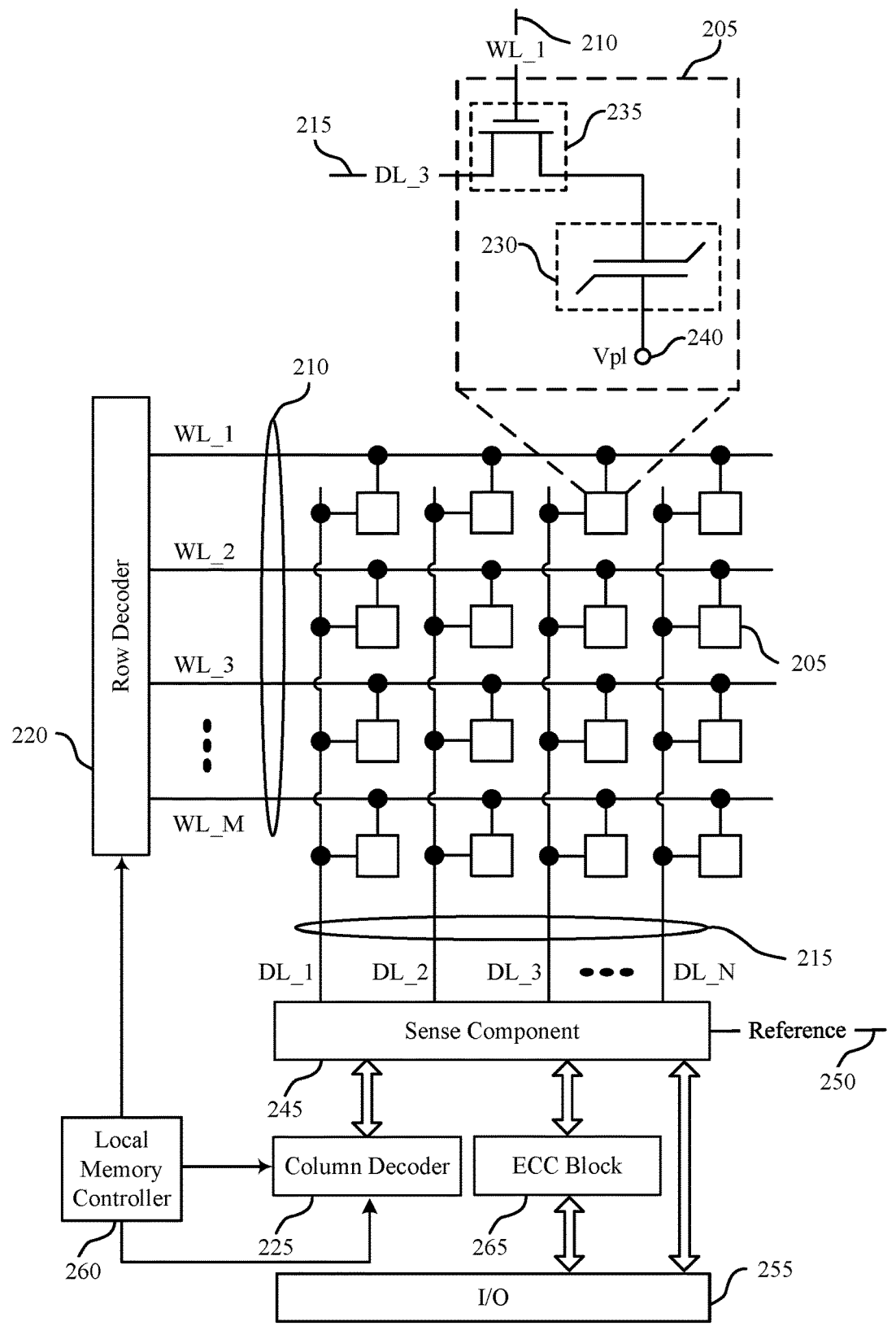
FIG. 2 illustrates an example of a memory die that supports extended error detection for a memory device in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through ECC block 265 by I/O 255. The ECC block 265 may perform an error correction operation on the detected logic state of memory cell 205 and output data (e.g., the stored data or corrected data) via I/O 255. In some other cases, the detected logic state of memory cell 205 may bypass ECC block 265 and be output via I/O 255. In some cases, the detected logic state of memory cell 205 may be output to both the ECC block 265 and the I/O 255. Here, the detected logic state of memory cell 205 may be output from the memory die 200 by the I/O 255 at a same time as ECC block 265 performs an error correction operation on the detected logic state of memory cell 205. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, sense component 245, and ECC block 265). The local memory controller 260 may be an example of the local memory controller 165 described with reference to FIG. 1. In some cases, one or more of the row decoder 220, column decoder 225, sense component 245, and ECC block 265 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

During the write operation, the ECC block 265 or the local memory controller 260 may generate error detection or correction information. For example, the ECC block 265 may receive data from the host device as part of a write operation. The ECC block 265 may determine or generate error detection or correction information associated with the data. In some cases, the ECC block 265 may include error detection logic or may cause error detection logic (not shown) to perform the error detection operations described herein. The ECC block 265 may cause the data and the error detection or correction information to be stored in one or more memory cells 205 as part of the write operation. The type of error detection or correction information generated by the ECC block 265 may correspond to a type of error detection operation performed by the ECC block 265. For example, if the ECC block 265 performs a SEC or SECDED error detection operation, the ECC block 265 may generate a SEC or SECDED codeword as part of the write operation. The SEC or SECDED codewords may correspond to error detection information used by the ECC block 265 to detect and/or correct errors within the data when performing a SEC or SECDED error detection operation respectively. Alternatively, if the ECC block 265 performs an error detection operation based on parity bits, the ECC block 265 may generate parity bits as part of the write operation.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

During the read operation, the ECC block 265 may retrieve data and associated error detection or correction information from the array of memory cells 205. The ECC block 265 may perform an error correction operation based on the data and the error detection or correction information. Performing an error correction operation at the memory device (e.g., by the ECC block 265 or the local memory controller 260) may improve the reliability of the memory device. The ECC block 265 may be configured to perform a single type of error detection operation (e.g., a SEC or SECDED error detection operation, an error detection operation based on parity bits) or may be configured to perform a combination of error detection operations (e.g., an error detection operation based on parity bits and a SEC or SECDED error detection operation).

In a first example, the ECC block 265 may perform a SEC error detection operation on the data retrieved from the memory array. For example, the prefetch width may be 256 bits, and the data may include two (2) 128-bit arrays. The SEC codewords may include two (2) 8-bit SEC codewords (e.g., corresponding to the two (2) 128-bit arrays). That is, the ECC block 265 may retrieve the two (2) 128-bit arrays and the two (2) 8-bit SEC codewords from the memory array. The ECC block 265 may perform the SEC error detection operation and correct single bit errors, which may account for approximately 60% of the errors occurring within data stored at the memory device. In some cases (e.g., in the event of a double-bit error), a SEC error detection operation may inadvertently flip a bit that was correct, thus creating an additional bit-error. Double-bit errors may account for approximately 6% of the errors occurring within data stored at the memory device, therefore resulting in an additional bit-error approximately 6% of the time. Thus, if the ECC block 265 performs a SEC error detection operation, up to 40% of errors within the data may be undetectable. It may be desirable to have increased reliability.

In a second example, the ECC block 265 may perform a SECDED error detection operation on the data retrieved from the memory array. For example, the prefetch width may be 256 bits, and the data may include two (2) 128-bit arrays. The SECDED codewords may include two (2) 9-bit SECDED codewords (e.g., corresponding to the two (2) 128-bit arrays). That is, the ECC block 265 may retrieve the two (2) 128-bit arrays and the two (2) 9-bit SECDED codewords from the memory array. The increased size of the codewords (e.g., from an 8-bit SEC codeword to a 9-bit SECDED codeword) may result in a wider internal ECC channel. The increased codeword size may also use more memory cells 205 to store the data and the ECC codewords. This may lead to an increased portion of the memory die 200 being allocated for ECC circuitry and the storage of ECC information (e.g., from 6% for SEC to 12% for SECDED).

The ECC block 265 may perform the SECDED error detection operation and correct single-bit errors and detect even-bit errors. That is, if the ECC block 265 performs a SECDED error detection operation, the ECC block 265 may provide an increased reliability when compared to performing a SEC error detection operation (e.g., from correcting or detecting 60% of errors to correction or detecting 66% of errors). However, it may be desirable to further decrease a quantity of undetectable errors (e.g., decrease the quantity of undetectable errors from 34% undetectable errors).

In a third example, the ECC block 265 may perform an error detection operation based on multidimensional parity information. For example, the prefetch width may be 256 bits and the data may include two (2) 128-bit arrays. Additionally or alternatively, the data may include one (1) 256-bit array. The parity information may include two (2) sets of parity bits where each set of parity bits includes sixteen (16) parity bits. The increased quantity of error detection information bits (e.g., from eight (8) or nine (9) to 32) may result in an increased portion of the memory die 200 being allocated for the ECC circuitry and the storage of ECC information (e.g., from 6% or 12% to 15% or 20% depending on a width of internal channels). The ECC block 265 may perform the error detection operation based on the parity bits and detect errors including a single bit, two bits, or more than two bits. In some cases, the error detection operation based on the parity bits may detect and correct more errors when compared to SEC or SECDED error detection operations (e.g., from detecting or correcting 66% of errors by a SECDED error detection operation to detecting or correction 99% of errors by an error detection operation based on parity bits). The increased error detection may increase the reliability of the memory die 200.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
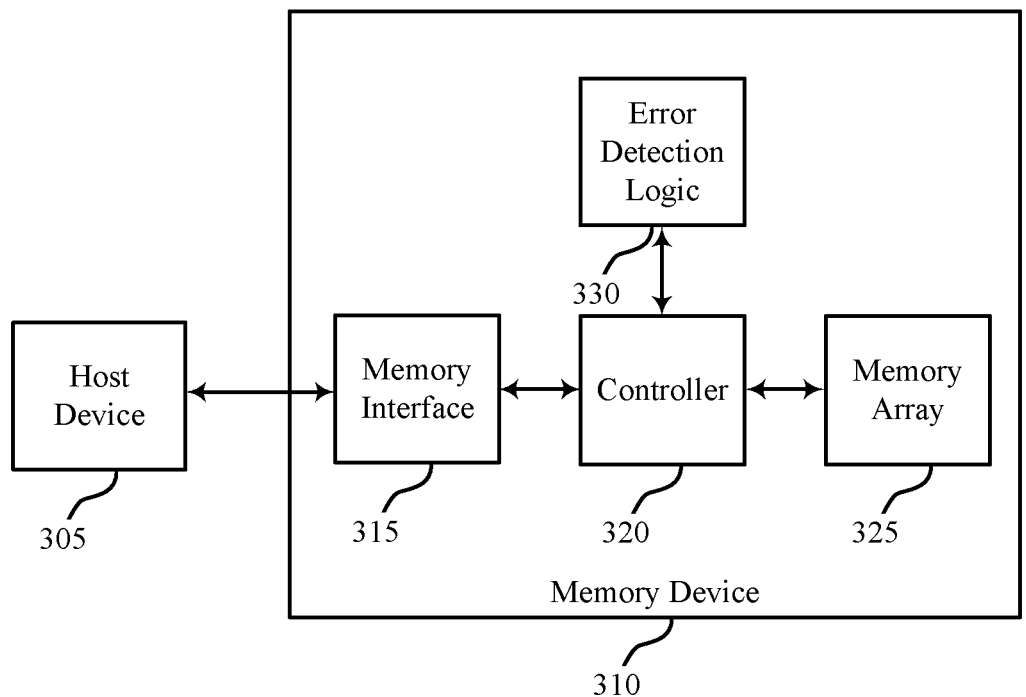
FIG. 3 illustrates an example of a system that supports extended error detection for a memory device in accordance with examples as disclosed herein.

FIG. 3 illustrates an example of a system 300 that supports extended error detection for a memory device in accordance with examples as disclosed herein. The system 300 may include one or more components described herein with reference to FIGS. 1 and 2, among others. For example, the system 300 may include a host device 305, which may be an example of the external memory controller 105 as described with reference to FIG. 1; a memory device 310, which may be an example of the memory device 110, the memory dice 160, or the memory die 200 as described with reference to FIGS. 1 and 2; a controller 320, which may be an example of the device memory controller 155, one or more local memory controllers 165, or the local memory controller 260 as described with reference to FIGS. 1 and 2, or any combination thereof; a memory array 325, which may be an example of the memory arrays 170 as described with reference to FIG. 1; and error detection logic 330 which may be an example of the local memory controller 260 or the ECC block 265 as described with reference to FIG. 2. The memory device 310 may also include a memory interface 315.

Host device 305 may send commands to memory device which may be received via the memory interface 315. The commands may include access commands to perform one or more access operations (e.g., a read operation, a write operation) at the memory array 325. The controller 320 may receive commands from the memory interface 315, process the commands, and execute the commands on memory array 325. The error detection logic 330 may perform one or more error detection operations on data associated with the access commands.

During a write operation, the host device 305 may send a write command to the memory interface 315. The write command may include data to be written to the memory array 325. The memory interface 315 may send the data to the controller 320 which may in turn communicate the data to the error detection logic 330. The error detection logic 330 may generate error detection or correction information based on the data received from controller 320. For example, the error detection logic 330 may generate parity bits based on the data. In some cases, the error detection or correction information may further include SEC or SECDED codewords. That is, the error detection logic 330 may be configured to perform an error detection operation using the parity bits and perform and SEC or SECDED operation. The error detection logic 330 may communicate the error detection or correction information (e.g., the parity bits) to the controller 320 to be stored at the memory array 325 with the data. The controller 320 may store the data at the memory array 325 (e.g., at a location indicated by the write command received from the host device 305). The controller 320 may also store the parity bits at the memory array 325. In some cases, the parity bits may be stored at a same location as the data (e.g., a same sub-array, a same row). In some other cases, the parity bits may be stored at a different portion of the memory array 325 than the data (e.g., a different sub-array, a different row).

During a read operation, the host device 305 may send a read command to the memory interface 315. The read command may indicate data to be read from the memory array 325. The memory interface 315 may communicate the read command to the controller 320 which may in turn read the data (e.g., the first data) from the memory array 325. The controller 320 may also read the parity bits (e.g., that are associated with the data) from the memory array 325. The controller 320 may communicate both the data and the parity bits to the error detection logic 330. Communicating the data and the parity bits from the memory array 325 to the controller 320 may correspond to a wider internal channel between the memory array 325 and the controller 320 (e.g., as compared to an internal channel width when communicating the data between the memory array 325 and the controller 320). The memory array 325 may also have to allocate memory cells to storing the parity bits. This may lead to an increased portion of the memory array 325 being allocated for error detection circuitry and the storage of error detection information.

The error detection logic 330 may perform an error detection operation based on the data to detect and/or correct errors associated with the data (e.g., due to leakage, parasitic coupling, or EMI). During the error detection operation, the error detection logic 330 may generate parity bits based on the data received from the controller 320. The error detection logic 330 may compare the received parity bits with the generated parity bits. In the event that the received parity bits and the generated parity bits do not match, the error detection logic 330 may detect an error.

The error detection operations performed by the error detection logic 330 may add delay into the read operation. For example, an error detection operation may take between several nanoseconds, or may add one or more clock cycles of latency to outputting the data to the host device 305. In some instances (e.g., if the memory device 310 is operating according to a low latency mode), the controller 320 may communicate the data to the memory interface 315 and bypass the error detection logic 330 (thus eliminating the delay resulting from the error detection operations performed at the error detection logic 330). Here, data may be transferred between the memory interface 315 at a same time as the error detection logic 330 performs an error detection operation on the data. If an error is detected by the error detection logic 330 during the execution of the command, an indicator of the detected error (and, in some cases, corrected data) may be retroactively communicated to the host device 305. The low latency mode may be based on a licensing key to be implemented by a memory device 310. The host device 305 may provide the licensing key to the memory device 310 in order to operate the memory device 310 according to the low latency mode.

The error correction operation may detect and/or correct various types of errors based on a type of the error correction operation. The error detection logic 330 may perform an error detection operation that detects and/or corrects single-bit errors, double-bit errors, and errors that impact more than two bits. The error detection logic 330 may associate each bit of the data read during the read operation with two or more bits of parity information. For example, the error detection logic 330 may use two or more sets of parity bits to detect errors within a matrix of the data. Each set of parity bits may correspond to a dimension of the matrix of data. Thus, each bit of the data within the matrix may be associated with two or more parity bits corresponding to the parity dimensions.

The error detection logic 330 may communicate an indicator of the detected and/or corrected data to the controller 320. The controller 320 may communicate the indicator of the detected error and/or the corrected data to the host device 305. The indicator of the detected and/or corrected error may be sent by the memory interface 315. For example, the indicator of the detected and/or corrected error may be sent by a channel for communicating error detection information. Alternatively, the indicator of the detected and/or corrected error may be sent by a multi-functional channel. For example, the indicator may be sent by a data mask/invert (DMI) pin, a DQ channel, or some other type of multi-functional channel.

The memory device 310 may communicate the indicator of the detected and/or corrected data by setting the value of one or more registers to indicate the detected and/or corrected error. The host device 305 may poll the register or registers to determine the presence of or a type of error detected and/or corrected within the data. For example, the controller 320 may set a single register to a value indicating the presence of a detected and/or corrected error within the data. In another example, the controller 320 may set a value of a register corresponding to a specific type of detected and/or corrected error. That is, there may be multiple registers that correspond to specific types of detected and/or corrected errors. Here, the controller 320 may determine which register corresponds to the type of error detected and/or corrected by the error detection logic 330. The controller 320 may then set the register value to indicate that type of detected and/or corrected error to the host device 305. There may be registers corresponding to each type of detected and/or corrected error. In some other cases, there may be registers corresponding to a group of detected and/or corrected errors. That is, the granularity of indicated errors may be based on the quantity of registers.

FIG. 4 illustrates an example of a data matrix 400 that supports extended error detection for a memory device in accordance with examples as disclosed herein. The parity bits 415 of the data matrix 400 may be generated by the memory device as described with reference to FIGS. 1 through 3. The data D0 through D255 may be received and stored at the memory device, which may be an example of the memory device 110, the memory die 160, the memory die 200, or the memory device 310 as described with reference to FIGS. 1 through 3. The memory device may use the parity bits 415 to detect and/or correct some errors within the data D0 through D255 after the data has been stored in a memory array (e.g., as described with reference to FIGS. 1 through 3).

The data D0 through D255 may be an example of a burst of data communicated over an internal channel from a memory array to an error detection circuit (e.g., as described with reference to FIG. 3). The data may include a single array (e.g., a 256-bit array including data D0 through D255) or more than one (1) array (e.g., two (2) 128-bit arrays corresponding to D0 through D127 and D128 through D255). The data channel may have a quantity of data pins 405 that define the width of the channel. For example, the data channel may be sixteen (16) pins wide (e.g., DQ0 through DQ15). In other examples, the data channel may be less than sixteen (16) pins wide or more than sixteen (16) pins wide. The burst of data may also have a plurality of unit intervals (UIs) 410 (e.g., UIs 0 through 15), or time resources for communicating at least one (1) bit of data. In systems that use double-data rates, a UI 410 may occur at every clock edge, both rising and falling. In other systems that use single data rates, a UI 410 may occur every clock cycle.

The data matrix 400 may include parity bits 415. The parity bits 415 may be generated internally at the memory device and used internally at the memory device. The parity bits 415 may include 32 bits of information which may result in a portion of the memory device being allocated for error detection circuitry and storage of error detection information (e.g., 15% of a memory die associated with the memory device).

The parity bits 415 may include a first set of parity bits 415-*a* and a second set of parity bits 415-*b*. The first and second sets of parity bits 415 may correspond to a first and second dimension of the data matrix 400. The first and second dimensions of the data matrix 400 may correspond to rows and columns of the data matrix 400, or other dimensions such as a diagonal dimension or a cyclically shifted dimension of the data matrix 400. Each of the dimensions may be orthogonal to each other (e.g., the set of data bits associated with any given parity bit for one dimension may overlap with one data bit of the set of data bits associated with a different dimension). In some cases, the total quantity of parity bits 415 may be determined by the dimensions of the data matrix 400. For example, if the dimensions of the data matrix are 16×16, the quantity of parity bits 415 may be 32. Alternatively, if the dimensions of the data matrix 400 are 32×8, the quantity of parity bits 415 may be 40. In some cases, performance may be enhanced by making the dimensions of the data matrix 400 equal, or as close to equal as possible given a certain quantity of data bits.

In some examples, the dimensions of the data matrix 400 may correspond to the dimensions of the data bus width (DQ width) and the burst length (e.g. UIs). In the example of data matrix 400, each bit of the first set of parity bits 415-*a* corresponds to one of the UIs 410 and each bit of the second set of parity bits 415-*b* corresponds to one of the data pins 405. Parity bits 415-*a* may include 16 parity bits 0 through 15 that each correspond to parity information for the data associated with UIs 0 through 15. For example, parity bit 0 within the parity bits 415-*a* may indicate the parity for the data bits associated with UI 0 (e.g., D0, D16, D32, D48, D64, D80, D96, D112, D128, D144, D160, D176, D192, D208, D224, and D240). Parity bits 415-*b* may include 16 parity bits 0 through 15 that each correspond to parity information for the data associated with DQs 0 through 16. For example, parity bit 0 within the parity bits 415-*b* may indicate the parity for the data bits associated with DQ0

(e.g., D0, D1, D2, D3, D4, D5, D6, D7, D8, D9, D10, D11, D12, D13, D14, and D15). Thus, each bit of the data may be associated with two (2) or more parity bits. For example, data bit D30 may be associated with parity bit 14 from the set of parity bits 415-*a* and parity bit 1 from the set of parity bits 415-*b*.

Additionally or alternatively, one or more of the dimensions of the data matrix 400 may correspond to a multiple or a fraction of the dimensions of the data bus width (DQ width) and the burst length (e.g. UIs). For example, if the data bus width is 8 and the burst length is 32, the data matrix 400 may have dimensions of 16×16. That is, a first dimension of the data matrix 400 may be a multiple of the data bus width and the second dimension may be a fraction of the burst length. Alternatively, a first dimension of the data matrix 400 may be fraction of the data bus width and the second dimension may be a multiple of the burst length.

When the memory device performs the error detection operation, the memory device may compare parity bits 415 generated by the memory device based on the data read from the memory array (e.g., data D0 through D255) with parity bits 415 stored at the memory array (e.g., generated by the memory device during a write operation and based on data communicated to the memory device by the host device as part of the write operation). If the parity bits 415 match, the memory device may not detect an error with the data D0 through D255. However, the if parity bits 415 do not match, the memory device may detect an error associated with the data corresponding to the unmatched parity bits 415.

Table 1, shown below, shows a type of errors that may be detected by an error detection operation utilizing the parity bits 415 to detect errors within the data D0 through D255. In particular, Table 1 shows the types of errors that an error correction operation may detect when compared to a SEC operation or a SECDED operation. For example, Table 1 details that an error detection operation based on parity bits as described herein may correct a triple-bit error that includes three inverted bits on a same data pin 405 and three different UIs 410 while a SEC operation and a SECDED operation may not detect the triple-bit error.

TABLE 1

Types of Detected Errors

| Single-bit error | Error Detection Operation Based on Parity Bits Correct | SECDED Correct | SEC Correct |
|---|---|---|---|
| Triple-bit error on a single data pin 405 and three (3) different UIs 410 | Correct | No Detection | No Detection |
| Triple-bit error on three (3) different data pins 405 and a single UI 410 | Correct | No Detection | No Detection |
| Quint-bit error on a single data pin 405 and five (5) different UIs 410 | Correct | No Detection | No Detection |
| Even-bit (five (5) or more bits) error on a same data pin 405 or a same UI 410) | Correct | Detect | No Detection |
| Odd-bit (five (5) or more bits) error on a single data pin 405 or a single UI 410 | Correct | No Detection | No Detection |
| Double-bit error | Detect | Detect | No Detection |
| Triple-bit error on two (2) different data pins 405 and two different UIs 410 | Detect | No Detection | No Detection |
| Quad-bit error on a single data pin 405 and four (4) different UIs 410 | Detect | Detect | No Detection |
| Quad-bit error on four (4) different data pins 405 and a single UI 410 | Detect | Detect | No Detection |
| Quad-bit error on three (3) or four (4) different data pins 405 and two (2), three (3), or four (4) different UIs 410 | Detect | Detect | No Detection |
| Quad-bit error on two (2), three (3), or four (4) different data pins 405 and three (3) or four (4) different UIs 410 | Detect | Detect | No Detection |
| Quint-bit error on two (2) or more different data pins 405 and two (2) or more different UIs 410 | Detect | No Detection | No Detection |
| Even-bit (five (5) or more) error on an odd quantity of data pins 405 and/or an odd quantity of UIs 410 | Detect | Detect | No Detection |
| Odd-bit (five (5) or more) error on different data pins 405 or UIs 410 | Detect | No Detection | No Detection |
| Quad-bit error on split between two (2) data pins 405 and two (2) UIs 410 | No Detection | Detect | No Detection |
| Even-bit (five (5) or more) error split between an even quantity of data pins 405 and an even quantity of UIs 410 | No Detection | Detect | No Detection |

An error detection operation based on the parity bits 415-*a* and 415-*b* may detect more errors when compared to a SEC or SECDED operation. Further, the error detection operation based on parity bits 415-*a* and 415-*b* may also correct more errors when compared to a SEC or SECDED operation (e.g., an error detection operation based on parity bits 415-*a* and 415-*b* may correct 90% of errors as compared to 60% error correction from SEC or SECDED operations). Further, the error detection operation based on the parity bits 415-*a* and 415-*b* may inadvertently flip less bits when compared to a SEC or SECDED operation. Thus, the error detection operation based on the parity bits 415-*a* and 415-*b* may result in an increased reliability of the memory device. In some cases, the memory device may perform both an error detection operation based on the parity bits 415-*a* and 415-*b* and a SEC or SECDED operation. This may further increase the reliability of the memory device (e.g., when compared to performing the error detection operation based on the parity bits 415-*a* and 415-*b* without performing the SEC or SECDED operation).

FIG. 5 illustrates an example of a data matrix 500 that supports extended error detection for a memory device in accordance with examples as disclosed herein. The parity bits 515 of the data matrix 500 may be generated by the memory device as described with reference to FIGS. 1 through 4. The data may include two 128-bit arrays with data D0 through D127 that may be received and stored at the memory device. The memory device may be an example of the memory device 110, the memory die 160, the memory die 200, or the memory device 310 as described with reference to FIGS. 1 through 3. In some cases, the data matrix 500 may include aspects of data matrix 400. For example, the data pins 505, UIs 510, and parity bits 515 may be examples of the corresponding elements in the data matrix 400.

The data within the data matrix 500 may be an example of a burst of data communicated over an internal channel from a memory array to an error detection circuit (e.g., as described with reference to FIG. 3). The data may include two (2) 128-bit arrays corresponding to data pins DQ0 through DQ7 and data pins DQ8 through DQ15. The data channel may have a quantity of data pins 505 that define the width of the channel. For example, the data channel may be sixteen (16) pins wide (e.g., DQ0 through DQ15). In other examples, the data channel may be less than sixteen pins wide (e.g., eight (8) pins wide) and the burst length may be longer to communicate the two (2) 128-bit arrays of data. The burst of data may also have a plurality of UIs 510, or time resources for communicating at least one (1) bit of data.

The data matrix 500 may include parity bits 515 which may be similar to parity bits 415 as described with reference to FIG. 4. However, while the parity bits 415 included two sets of parity bits 415-*a* and 415-*b*, parity bits 515 include three sets of parity bits 515-*a*, 515-*b*, and 515-*c*. The increased quantity of parity bits 515 may increase a portion of the memory device being allocated for error detection circuitry and storage of error detection information. The third set of parity bits 515-*c* may provide additional parity information for the data. For example, the set of parity bits 515-*b* may provide parity information corresponding to each of the data pins 505. That is, each of the parity bits 515-*b* may indicate parity information corresponding to a single data pin 505. The set of parity bits 515-*a* and the set of parity bits 515-*c* may include parity information corresponding to a UI 510. The first set of parity bits 515-*a* may include parity information for the first 128-bit array (e.g., corresponding to data D0 through D127 associated with data pins DQ0 through DQ7) and the set of parity bits 515-*c* may provide parity information for the second 128-bit data array (e.g., corresponding to data D0 through D127 associated with data pins DQ8 through DQ15).

In another example, the third set of parity bits 515-*c* may correspond to a third dimension of the data matrix 500. For example, while the first set of parity bits 515-*a* may include parity information for each row of the data matrix 500 (e.g., each of the parity bits 515-*a* may include parity information for DQ0-DQ15 for one UI) and the second set of parity bits 515-*b* may include parity information for each column of the data matrix 500 (e.g., each of the parity bits 515-*b* may include parity information for ui0-ui15 for one DQ), the third set of parity information may include parity information for data on a third dimension (e.g., diagonal dimension, cyclically shifted dimension) of the data matrix 500. Alternatively, the first set of parity bits 515-*a*, second set of parity bits 515-*b*, and third set of parity bits 515-*c* may be associated with other dimensions (e.g., different cyclically shifted dimensions). Each of the dimensions may be orthogonal to each other (e.g., the set of data bits associated with any given parity bit for one dimension may overlap with one data bit of the set of data bits associated with a different dimension).

When the memory device performs the error detection operation, the memory device may compare parity bits 515 generated by the memory device based on the data read from the memory array with parity bits 515 stored at the memory array (e.g., generated by the memory device during a write operation and based on data communicated to the memory device by the host device as part of the write operation). If the parity bits 515 match, the memory device may not detect an error with the data. However, the if parity bits 515 do not match, the memory device may detect an error associated with the data corresponding to the unmatched parity bits 515.

FIG. 6 illustrates an example of a data matrix 600 that supports extended error detection for a memory device in accordance with examples as disclosed herein. The data D0 through D255 may be received and stored at the memory device, which may be an example of the memory device 110, the memory die 160, the memory die 200, or the memory device 310 as described with reference to FIGS. 1 through 3. In some cases, the data matrix 600 may include aspects of data matrices 400 and 500 as described with reference to FIGS. 4 and 5. For example, the data pins 605 and UIs 610 may be examples of the corresponding elements in the data matrices 400 and 500.

The data matrix 600 may include data D0 through D255, which may be an example of a burst of data communicated over an internal channel from a memory array to an error detection circuit (e.g., as described with reference to FIG. 3). The data may include a single array (e.g., a 256-bit array including data D0 through D255) or more than one (1) array (e.g., two (2) 128-bit arrays corresponding to D0 through D127 and D128 through D255). The data channel may have a quantity of data pins 605 that define the width of the channel. The burst of data may also have a plurality of UIs 610, or time resources for communicating at least one (1) bit of data.

The data matrix 600 may include parity results 615-*a* and 615-*b*. The first set of parity results 615-*a* may correspond to each of the UIs 610 and the second set of parity results 615-*b* may correspond to each of the data pins 605. The parity results may include bits corresponding to errors detected within the data. That is, the memory device may retrieve the data from a memory array and perform an error detection operation. The error detection operation may include the memory device comparing parity bits (e.g., parity bits 415 and 515 as described with reference to FIGS. 4 and 5) generated based on the data within the data matrix 600 and the parity bits stored at the memory array. If the parity bits match, the memory device may not detect an error with the corresponding data pin 605 or UI 610. The parity results 615 may include a logic value '0' to indicate that the parity bits match (e.g., no detected error). However, if the parity bits do not match, the memory device may detect an error along the corresponding dimension (e.g., data pin 605 dimension or UI 610 dimension). The parity results 615 may include a logic value '1' to indicate that the parity bits do not match (e.g., a detected error). Based on the parity results indicating errors, the memory device may detect and/or correct various errors within the data D0 through D255.

In data matrix 600, the parity results 615 may indicate a single-bit error. That is, the parity results 615-*a* may indicate an error associated with the UI ui14. Further, the parity results 615-*b* may indicate an error associated with the data pin DQ1. The memory device may determine a single-bit error at data bit D30 where the detected error indicated by parity results 615-*a* and 615-*b* intersect. Here, the memory device may correct (e.g., invert) the data bit D30. In some cases, the parity results 615-*a* may correspond to other types of errors within the data (e.g., other than a single-bit error at data bit D30). For example, if data bits D15, D31, and D14 are incorrect (e.g., inverted), the parity results 615-*a* and 615-*b* would remain the same. Here, the memory device may still invert data bit D30, thus inadvertently inverting a fourth data bit (e.g., introducing an additional error into the data). Thus, the memory device may only correct errors where the combination of parity results has a low likelihood of being caused by a different combination of inverted data or parity bits. For example, where the results 615-*a* and 615-*b* indicate a single-bit error, other combinations providing the same results may be far less likely (e.g., may require three bits to be inverted). Alternatively, where the results may indicate a double-bit error, it may be possible that a triple-bit error including inversion of some parity bits may result in the same parity results. Additionally or alternatively, where a single parity bit indicates an error (e.g., in parity results 615-*a* or parity results 615-*b*), it may be as likely or more likely caused by inversion of the parity bit as any other combination. For example, where an error is indicated only with the data pin DQ1, it may be at least as likely that the parity bit has flipped as that the DQ1 parity bit is correct, as compared to one or more data bits (e.g., D14 and D30) and another parity bit (e.g., the parity bit associated with UI 14). In some cases, a threshold may be applied for correcting the data bits indicated as having errors. The threshold may be based on the likelihood of the detected error compared with other combinations of inverted data and parity bits indicating the same parity results. In some cases, additional parity information may be added to detect inversion of parity bits (e.g., a single parity bit for each of the sets of parity bits).

After performing the error detection operation, the memory device may detect a single-bit error and correct the single-bit error. The memory device may indicate the detected and corrected error to a host device, thus increasing the reliability of the memory device.

FIG. 7 illustrates an example of a data matrix 700 that supports extended error detection for a memory device in accordance with examples as disclosed herein. The data D0 through D255 may be received and stored at the memory device, which may be an example of the memory device 110, the memory die 170, the memory die 200, or the memory device 310 as described with reference to FIGS. 1 through 3. In some cases, the data matrix 700 may include aspects of the data matrices as described with reference to FIGS. 4 through 6. For example, the data pins 705 and UIs 710 may be examples of the corresponding elements in FIGS. 4 through 6. Further, the parity results 715 may be examples of the parity results as described with reference to FIG. 6.

The data matrix 700 may include data D0 through D255, which may be an example of a burst of data communicated over an internal channel from a memory array to an error detection circuit (e.g., as described with reference to FIG. 3). The data may include a single array (e.g., a 257-bit array including data D0 through D255) or more than one (1) array (e.g., two (2) 128-bit arrays corresponding to D0 through D127 and D128 through D255). The data channel may have a quantity of data pins 705 that define the width of the channel. The burst of data may also have a plurality of UIs 710, or time resources for communicating at least one (1) bit of data.

The data matrix 700 may include parity results 715-*a* and 715-*b*. The first set of parity results 715-*a* may correspond to each of the UIs 710 and the second set of parity results 715-*b* may correspond to each of the data pins 705. The parity results may include bits corresponding to errors detected within the data. That is, the memory device may retrieve the data from a memory array and perform an error detection operation. The error detection operation may include the memory device comparing parity bits (e.g., parity bits 415 and 515 as described with reference to FIGS. 4 and 5) generated based on the data within the data matrix 700 and the parity bits stored at the memory array. If the parity bits match, the memory device may not detect an error with the corresponding data pin 705 or UI 710. The parity results 715 may include a logic value '0' to indicate that the parity bits match (e.g., no detected error). However, if the parity bits do not match, the memory device may detect an error along the corresponding dimension (e.g., data pin 705 dimension or UI 710 dimension). The parity results 715 may include a logic value '1' to indicate that the parity bits do not match (e.g., a detected error). Based on the parity results indicating errors, the memory device may detect and/or correct various errors within the data D0 through D255.

The data matrix 700 may include a double-bit error (e.g., data bits D14 and D30 may be inverted) across two data pins 705 and on a same UI 710. The parity results 715-*a* may not indicate any errors associated with the UIs 710. The parity results 715-*b* may indicate an error detected at the data pins DQ0 and DQ1. The memory device may detect a double-bit error across data pins DQ0 and DQ1 and on a same UI 710, but may not detect the specific UI 710. That is, although the data bits D14 and D30 are inverted (e.g., at ui14), the memory device may detect the double-bit error along the data pins 705 dimension. Therefore, the memory device may detect a double-bit error associated with data pins DQ0 and DQ1 and at a same UI 710. In some cases, the memory device may similarly detect any even-bit error occurring across a same UI 710. For example, if data bits D14, D30, D46, and D62 are all inverted, the parity results 715-*a* may not indicate any detected errors, and the parity results 715-*b* would indicate a detected error associated with data pins DQ0 through DQ3. Here, the memory device would detect a quad-bit error associated with data pins DQ through D3 and occurring on a same UI 710.

After performing the error detection operation, the memory device may detect the double-bit error and indicate the detected error to a host device, thus increasing the reliability of the memory device.

FIG. 8 illustrates an example of a data matrix 800 that supports extended error detection for a memory device in accordance with examples as disclosed herein. The data D0 through D255 may be received and stored at the memory device, which may be an example of the memory device 110, the memory die 170, the memory die 200, or the memory device 310 as described with reference to FIGS. 1 through 3. In some cases, the data matrix 800 may include aspects of the data matrices as described with reference to FIGS. 4 through 7. For example, the data pins 805 and UIs 810 may be examples of the corresponding elements in FIGS. 4 through 7. Further, the parity results 815 may be examples of the parity results as described with reference to FIGS. 6 and 7.

The data matrix 800 may include data D0 through D255, which may be an example of a burst of data communicated over an internal channel from a memory array to an error detection circuit (e.g., as described with reference to FIG. 3). The data may include a single array (e.g., a 258-bit array including data D0 through D255) or more than one (1) array (e.g., two (2) 128-bit arrays corresponding to D0 through D128 and D128 through D255). The data channel may have a quantity of data pins 805 that define the width of the channel. The burst of data may also have a plurality of UIs 810, or time resources for communicating at least one (1) bit of data.

The data matrix 800 may include parity results 815-*a* and 815-*b*. The first set of parity results 815-*a* may correspond to each of the UIs 810 and the second set of parity results 815-*b* may correspond to each of the data pins 805. The parity results may include bits corresponding to errors detected within the data. That is, the memory device may retrieve the data from a memory array and perform an error detection operation. The error detection operation may include the memory device comparing parity bits (e.g., parity bits 415 and 515 as described with reference to FIGS. 4 and 5) generated based on the data within the data matrix 800 and the parity bits stored at the memory array. If the parity bits match, the memory device may not detect an error with the corresponding data pin 805 or UI 810. The parity results 815 may include a logic value '0' to indicate that the parity bits match (e.g., no detected error). However, if the parity bits do not match, the memory device may detect an error along the corresponding dimension (e.g., data pin 805 dimension or UI 810 dimension). The parity results 815 may include a logic value '1' to indicate that the parity bits do not match (e.g., a detected error). Based on the parity results indicating errors, the memory device may detect and/or correct various errors within the data D0 through D255.

The data matrix 800 may include a double-bit error (e.g., data bits D13 and D14 may be inverted) across two UIs 810 and on one data pin 805. The parity results 815-*a* may indicate an error detected at UIs ui13 and ui14. The parity results 815-*b* may not detect any errors associated with the data pins 805. The memory device may detect a double-bit error across UIs ui13 and ui14 and along the data pin 805 dimension, but may not detect the specific data pin 805. That is, although the data bits D13 and D14 are inverted (e.g., at data pin DQ0), the memory device may detect the double-bit error along the UI 810 dimension. Therefore, the memory device may detect a double-bit error associated with UIs ui13 and ui14 and on a single data pin 805. In some cases, the memory device may similarly detect any even-bit error occurring on a same data pin 805. For example, if data bits D12, D13, D14, and D15 are all inverted, the parity results 815-*b* may not indicate any detected errors, and the parity results 815-*a* may indicate a detected error associated with UIs 12 through 15. Here, the memory device may detect a quad-bit error associated with UIs 12 through and occurring on a same data pin 805.

After performing the error detection operation, the memory device may detect the double-bit error and indicate the detected error to a host device, thus increasing the reliability of the memory device.

FIG. 9 illustrates an example of a data matrix 900 that supports extended error detection for a memory device in accordance with examples as disclosed herein. The data D0 through D255 may be received and stored at the memory device, which may be an example of the memory device 110, the memory die 170, the memory die 200, or the memory device 310 as described with reference to FIGS. 1 through 3. In some cases, the data matrix 900 may include aspects of the data matrices as described with reference to FIGS. 4 through 8. For example, the data pins 905 and UIs 910 may be examples of the corresponding elements in FIGS. 4 through 8. Further, the parity results 915 may be examples of the parity results as described with reference to FIGS. 6 through 8.

The data matrix 900 may include data D0 through D255, which may be an example of a burst of data communicated over an internal channel from a memory array to an error detection circuit (e.g., as described with reference to FIG. 3). The data may include a single array (e.g., a 259-bit array including data D0 through D255) or more than one (1) array (e.g., two (2) 129-bit arrays corresponding to D0 through D129 and D129 through D255). The data channel may have a quantity of data pins 905 that define the width of the channel. The burst of data may also have a plurality of UIs 910, or time resources for communicating at least one (1) bit of data.

The data matrix 900 may include parity results 915-*a* and 915-*b*. The first set of parity results 915-*a* may correspond to each of the UIs 910 and the second set of parity results 915-*b* may correspond to each of the data pins 905. The parity results may include bits corresponding to errors detected within the data. That is, the memory device may retrieve the data from a memory array and perform an error detection operation. The error detection operation may include the memory device comparing parity bits (e.g., parity bits 415 and 515 as described with reference to FIGS. 4 and 5) generated based on the data within the data matrix 900 and the parity bits stored at the memory array. If the parity bits match, the memory device may not detect an error with the corresponding data pin 905 or UI 910. The parity results 915 may include a logic value '0' to indicate that the parity bits match (e.g., no detected error). However, if the parity bits do not match, the memory device may detect an error along the corresponding dimension (e.g., data pin 905 dimension or UI 910 dimension). The parity results 915 may include a logic value '1' to indicate that the parity bits do not match (e.g., a detected error). Based on the parity results indicating errors, the memory device may detect and/or correct various errors within the data D0 through D255.

The data matrix 900 may include a double-bit error (e.g., data bits D15 and D30 may be inverted) across two data pins 905 and UIs 910. The parity results 915-*a* may indicate an error detected at UIs ui14 and ui15. The parity results 915-*b* may indicate an error detected at data pins DQ0 and DQ1. The memory device may detect a double-bit error across UIs ui14 and ui15 and on data pins DQ0 and DQ1, but may not correct the double-bit error. That is, the parity results 915-*a* and 915-*b* may indicate the same detected errors if data bits D14 and D31 are inverted. Therefore, the memory device may detect a double-bit error associated with UIs ui14 and ui15 and data pins DQ0 and DQ1. In some cases, the memory device may similarly detect bit errors impacting three, four, or more bits where each inverted data bit occurs on a unique data pin 905 and a unique UI 910. That is, the memory device may detect the type of bit-error but may not correct the error.

After performing the error detection operation, the memory device may detect the double-bit error and indicate the detected error to a host device, thus increasing the reliability of the memory device.

FIG. 10 illustrates an example of a data matrix 1000 that supports extended error detection for a memory device in accordance with examples as disclosed herein. The data D0 through D255 may be received and stored at the memory device, which may be an example of the memory device 110, the memory die 170, the memory die 200, or the memory device 310 as described with reference to FIGS. 1 through 3. In some cases, the data matrix 1000 may include aspects of the data matrices as described with reference to FIGS. 4 through 9. For example, the data pins 1005 and UIs 1010 may be examples of the corresponding elements in FIGS. 4 through 9. Further, the parity results 1015 may be examples of the parity results as described with reference to FIGS. 6 through 9.

The data matrix 1000 may include data D0 through D255, which may be an example of a burst of data communicated over an internal channel from a memory array to an error detection circuit (e.g., as described with reference to FIG. 3). The data may include a single array (e.g., a 256-bit array including data D0 through D255) or more than one (1) array (e.g., two (2) 128-bit arrays corresponding to D0 through D127 and D128 through D255). The data channel may have a quantity of data pins 1005 that define the width of the channel. The burst of data may also have a plurality of UIs 1010, or time resources for communicating at least one (1) bit of data.

The data matrix 1000 may include parity results 1015-*a* and 1015-*b*. The first set of parity results 1015-*a* may correspond to each of the UIs 1010 and the second set of parity results 1015-*b* may correspond to each of the data pins 1005. The parity results may include bits corresponding to errors detected within the data. That is, the memory device may retrieve the data from a memory array and perform an error detection operation. The error detection operation may include the memory device comparing parity bits (e.g., parity bits 415 and 515 as described with reference to FIGS. 4 and 5) generated based on the data within the data matrix 1000 and the parity bits stored at the memory array. If the parity bits match, the memory device may not detect an error with the corresponding data pin 1005 or UI 1010. The parity results 1015 may include a logic value '0' to indicate that the parity bits match (e.g., no detected error). However, if the parity bits do not match, the memory device may detect an error along the corresponding dimension (e.g., data pin 1005 dimension or UI 1010 dimension). The parity results 1015 may include a logic value '1' to indicate that the parity bits do not match (e.g., a detected error). Based on the parity results indicating errors, the memory device may detect and/or correct various errors within the data D0 through D255.

The data matrix 1000 may include a triple-bit error (e.g., data bits D15, D31, and D47 may be inverted) on three data pins 1005 and across one UI 1010. The parity results 1015-*a* may indicate an error detected at UI ui15. The parity results 1015-*b* may indicate an error detected at data pins DQ0, DQ1, and DQ2. The memory device may detect the triple-bit error and correct the triple-bit error (e.g., invert the data bits D15, D31, and D47). In some cases, the memory device may similarly detect and correct odd-bit errors impacting data bits across multiple data pins 1005 and on a single UI 1010. In some other cases, the memory device may similarly detect and correct odd-bit errors impacting data bits on a single data pin 1005 and across multiple UIs 1010.

After performing the error detection operation, the memory device may detect the double-bit error and indicate the detected error to a host device, thus increasing the reliability of the memory device.

FIG. 11 illustrates an example of a data matrix 1100 that supports extended error detection for a memory device in accordance with examples as disclosed herein. The data D0 through D255 may be received and stored at the memory device, which may be an example of the memory device 110, the memory die 170, the memory die 200, or the memory device 310 as described with reference to FIGS. 1 through 3. In some cases, the data matrix 1100 may include aspects of the data matrices as described with reference to FIGS. 4 through 10. For example, the data pins 1105 and UIs 1110 may be examples of the corresponding elements in FIGS. 4 through 10. Further, the parity results 1115 may be examples of the parity results as described with reference to FIGS. 6 through 10.

The data matrix 1100 may include data D0 through D255, which may be an example of a burst of data communicated over an internal channel from a memory array to an error detection circuit (e.g., as described with reference to FIG. 3). The data may include a single array (e.g., a 256-bit array including data D0 through D255) or more than one (1) array (e.g., two (2) 128-bit arrays corresponding to D0 through D127 and D128 through D255). The data channel may have a quantity of data pins 1105 that define the width of the channel. The burst of data may also have a plurality of UIs 1110, or time resources for communicating at least one (1) bit of data.

The data matrix 1100 may include parity results 1115-*a* and 1115-*b*. The first set of parity results 1115-*a* may correspond to each of the UIs 1110 and the second set of parity results 1115-*b* may correspond to each of the data pins 1105. The parity results may include bits corresponding to errors detected within the data. That is, the memory device may retrieve the data from a memory array and perform an error detection operation. The error detection operation may include the memory device comparing parity bits (e.g., parity bits 415 and 515 as described with reference to FIGS. 4 and 5) generated based on the data within the data matrix 1100 and the parity bits stored at the memory array. If the parity bits match, the memory device may not detect an error with the corresponding data pin 1105 or UI 1110. The parity results 1115 may include a logic value '0' to indicate that the parity bits match (e.g., no detected error). However, if the parity bits do not match, the memory device may detect an error along the corresponding dimension (e.g., data pin 1105 dimension or UI 1110 dimension). The parity results 1115 may include a logic value '1' to indicate that the parity bits do not match (e.g., a detected error). Based on the parity results indicating errors, the memory device may detect and/or correct various errors within the data D0 through D255.

The data matrix 1100 may include a quad-bit error (e.g., data bits D14, D15, D30, and D31 may be inverted) on two data pins 1105 and across two UIs 1110. The parity results 1115-*a* and 1115-*b* may not indicate any detected errors. Therefore, the memory device may not detect the quad-bit error. In some cases, the memory device may similarly fail to detect even-bit errors that include an even quantity of inverted bits on an even quantity of data pins 1105 and across an even quantity of UIs 1110.

Figure 12:
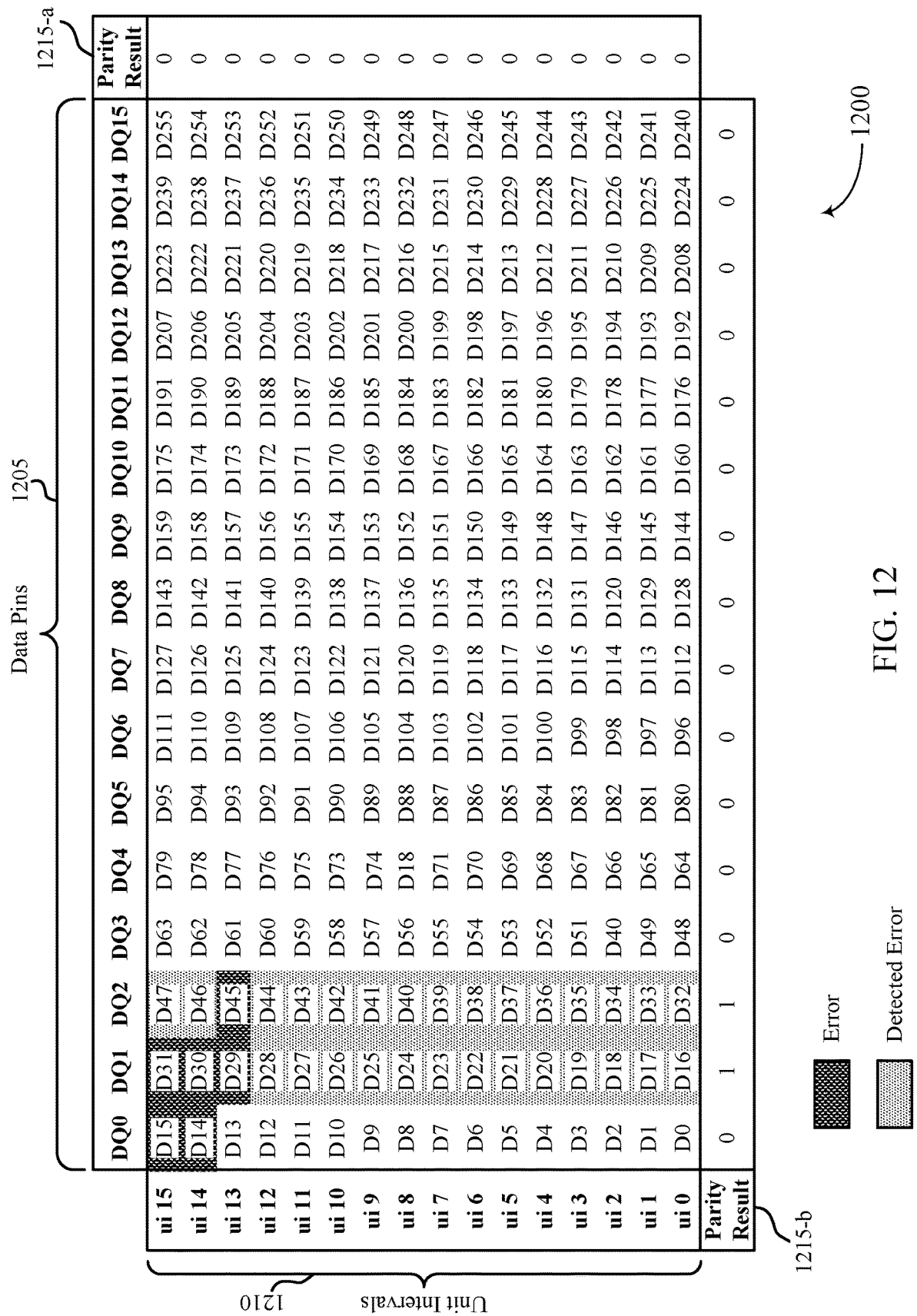

FIG. 12 illustrates an example of a data matrix 1200 that supports extended error detection for a memory device in accordance with examples as disclosed herein. The data D0 through D255 may be received and stored at the memory device, which may be an example of the memory device 110, the memory die 170, the memory die 200, or the memory device 310 as described with reference to FIGS. 1 through 3. In some cases, the data matrix 1200 may include aspects of the data matrices as described with reference to FIGS. 4 through 11. For example, the data pins 1205 and UIs 1210 may be examples of the corresponding elements in FIGS. 4 through 11. Further, the parity results 1215 may be examples of the parity results as described with reference to FIGS. 6 through 11.

The data matrix 1200 may include data D0 through D255, which may be an example of a burst of data communicated over an internal channel from a memory array to an error detection circuit (e.g., as described with reference to FIG. 3). The data may include a single array (e.g., a 256-bit array including data D0 through D255) or more than one (1) array (e.g., two (2) 128-bit arrays corresponding to D0 through D127 and D128 through D255). The data channel may have a quantity of data pins 1205 that define the width of the channel. The burst of data may also have a plurality of UIs 1210, or time resources for communicating at least one (1) bit of data.

The data matrix 1200 may include parity results 1215-*a* and 1215-*b*. The first set of parity results 1215-*a* may correspond to each of the UIs 1210 and the second set of parity results 1215-*b* may correspond to each of the data pins 1205. The parity results may include bits corresponding to errors detected within the data. That is, the memory device may retrieve the data from a memory array and perform an error detection operation. The error detection operation may include the memory device comparing parity bits (e.g., parity bits 415 and 515 as described with reference to FIGS. 4 and 5) generated based on the data within the data matrix 1200 and the parity bits stored at the memory array. If the parity bits match, the memory device may not detect an error with the corresponding data pin 1205 or UI 1210. The parity results 1215 may include a logic value '0' to indicate that the parity bits match (e.g., no detected error). However, if the parity bits do not match, the memory device may detect an error along the corresponding dimension (e.g., data pin 1205 dimension or UI 1210 dimension). The parity results 1215 may include a logic value '1' to indicate that the parity bits do not match (e.g., a detected error). Based on the parity results indicating errors, the memory device may detect and/or correct various errors within the data D0 through D255.

The data matrix 1200 may include an even-bit error (e.g., data bits D14, D15, D29, D30, D31, and D45 may be inverted) on different data pins 1205 and UIs 1210. The parity results 1215-*a* may not indicate a detected error and the parity results 1215-*b* may indicate a detected error on data pins DQ1 and DQ2. The memory device may detect an error but may not identify the quantity of impacted bits. That is, the parity results 1215 may be the same for the even-bit error on different data pins 1205 and different UIs 1210 as a double-bit error on a same UI 1210 and across different data pins 1205. After performing the error detection operation, the memory device may detect the double-bit error and indicate the detected error to a host device, thus increasing the reliability of the memory device.

FIG. 13 illustrates an example of a data matrix 1300 that supports extended error detection for a memory device in accordance with examples as disclosed herein. The data D0 through D255 may be received and stored at the memory device, which may be an example of the memory device 110, the memory die 170, the memory die 200, or the memory device 310 as described with reference to FIGS. 1 through 3. In some cases, the data matrix 1300 may include aspects of the data matrices as described with reference to FIGS. 4 through 12. For example, the data pins 1305 and UIs 1310 may be examples of the corresponding elements in FIGS. 4 through 12. Further, the parity results 1315 may be examples of the parity results as described with reference to FIGS. 6 through 12.

The data matrix 1300 may include data D0 through D255, which may be an example of a burst of data communicated over an internal channel from a memory array to an error detection circuit (e.g., as described with reference to FIG. 3). The data may include a single array (e.g., a 256-bit array including data D0 through D255) or more than one (1) array (e.g., two (2) 128-bit arrays corresponding to D0 through D127 and D128 through D255). The data channel may have a quantity of data pins 1305 that define the width of the channel. The burst of data may also have a plurality of UIs 1310, or time resources for communicating at least one (1) bit of data.

The data matrix 1300 may include parity results 1315-*a* and 1315-*b*. The first set of parity results 1315-*a* may correspond to each of the UIs 1310 and the second set of parity results 1315-*b* may correspond to each of the data pins 1305. The parity results may include bits corresponding to errors detected within the data. That is, the memory device may retrieve the data from a memory array and perform an error detection operation. The error detection operation may include the memory device comparing parity bits (e.g., parity bits 415 and 515 as described with reference to FIGS. 4 and 5) generated based on the data within the data matrix 1300 and the parity bits stored at the memory array. If the parity bits match, the memory device may not detect an error with the corresponding data pin 1305 or UI 1310. The parity results 1315 may include a logic value '0' to indicate that the parity bits match (e.g., no detected error). However, if the parity bits do not match, the memory device may detect an error along the corresponding dimension (e.g., data pin 1305 dimension or UI 1310 dimension). The parity results 1315 may include a logic value '1' to indicate that the parity bits do not match (e.g., a detected error). Based on the parity results indicating errors, the memory device may detect and/or correct various errors within the data D0 through D255.

The data matrix 1300 may include a data pin 1305 error (e.g., all of the data bits D0, D1, D2, D3, D4, D5, D6, D7, D8, D9, D10, D11, D12, D13, D14, and D15 associated with data pin DQ0 may be inverted). The parity results 1315-*a* may indicate a detected error associated with all of the UIs 1310 while the parity results 1315-*b* may not indicate any detected error. Here, the memory device may detect the data pin 1305 error but may not determine which of the data pins 1305 is associated with the inverted data. After performing the error detection operation, the memory device may detect the double-bit error and indicate the detected error to a host device, thus increasing the reliability of the memory device.

FIG. 14 illustrates an example of a data matrix 1400 that supports extended error detection for a memory device in accordance with examples as disclosed herein. The data D0 through D255 may be received and stored at the memory device, which may be an example of the memory device 110, the memory die 170, the memory die 200, or the memory device 310 as described with reference to FIGS. 1 through 3. In some cases, the data matrix 1400 may include aspects of the data matrices as described with reference to FIGS. 4 through 13. For example, the data pins 1405 and UIs 1410 may be examples of the corresponding elements in FIGS. 4 through 13. Further, the parity results 1415 may be examples of the parity results as described with reference to FIGS. 6 through 13.

The data matrix 1400 may include data D0 through D255, which may be an example of a burst of data communicated over an internal channel from a memory array to an error detection circuit (e.g., as described with reference to FIG. 3). The data may include a single array (e.g., a 256-bit array including data D0 through D255) or more than one (1) array (e.g., two (2) 128-bit arrays corresponding to D0 through D127 and D128 through D255). The data channel may have a quantity of data pins 1405 that define the width of the channel. The burst of data may also have a plurality of UIs 1410, or time resources for communicating at least one (1) bit of data.

The data matrix 1400 may include parity results 1415-*a* and 1415-*b*. The first set of parity results 1415-*a* may correspond to each of the UIs 1410 and the second set of parity results 1415-*b* may correspond to each of the data pins 1405. The parity results may include bits corresponding to errors detected within the data. That is, the memory device may retrieve the data from a memory array and perform an error detection operation. The error detection operation may include the memory device comparing parity bits (e.g., parity bits 415 and 515 as described with reference to FIGS. 4 and 5) generated based on the data within the data matrix 1400 and the parity bits stored at the memory array. If the parity bits match, the memory device may not detect an error with the corresponding data pin 1405 or UI 1410. The parity results 1415 may include a logic value '0' to indicate that the parity bits match (e.g., no detected error). However, if the parity bits do not match, the memory device may detect an error along the corresponding dimension (e.g., data pin 1405 dimension or UI 1410 dimension). The parity results 1415 may include a logic value '1' to indicate that the parity bits do not match (e.g., a detected error). Based on the parity results indicating errors, the memory device may detect and/or correct various errors within the data D0 through D255.

The data matrix 1400 may include a UI 1410 error (e.g., all of the data bits D15, D31, D47, D63, D79, D95, D111, D127, D143, D159, D175, D191, D207, D223, D239, and D255 associated with UI 15 may be inverted). The parity results 1415-*a* may not detect any errors associated with a UI 1410 while the parity results 1415-*b* may indicate a detected error associated with all of the data pins 1405. Here, the memory device may detect the UI 1410 error but may not determine which of the UIs 1410 is associated with the inverted data. After performing the error detection operation, the memory device may detect the double-bit error and indicate the detected error to a host device, thus increasing the reliability of the memory device.

Figure 15:
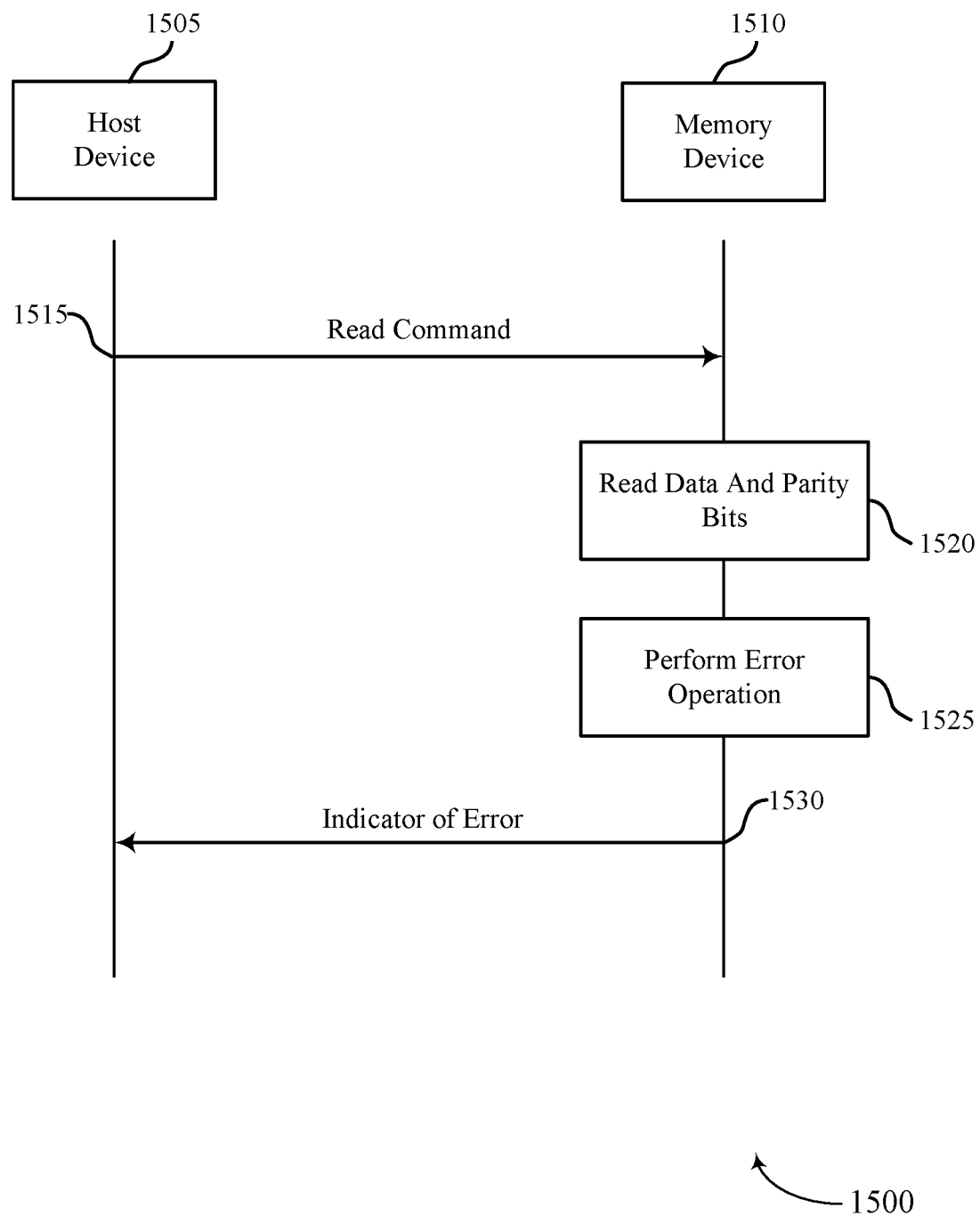
FIG. 15 illustrates an example of a process flow that supports extended error detection for a memory device in accordance with examples as disclosed herein.

FIG. 15 illustrates an example of a process flow 1500 that supports extended error detection for a memory device in accordance with examples as disclosed herein. The process flow 1500 may implement aspects of the systems 100 and 300 and memory die 200 described with reference to FIGS. 1 through 3. The process flow 1500 may include operations performed by a host device 1505, which may be an example of host device 305 as described with reference to FIG. 3. Host device 1505 may implement aspects of the external memory controller 105 as described with reference to FIG. 1. The process flow 1500 may further include operations performed by a memory device 1510, which may be an example of the memory device 110, the memory array 170, or the memory die 200, or the memory device 310 as described with reference to FIGS. 1 through 3. The memory device 1510 may perform operations on matrices of data, which may be examples of the data matrices as described with reference to FIGS. 4 through 14.

At 1515, the memory device 1510 may receive a read command from host device 1505. The memory device 1510 may include a memory array.

At 1520, the memory device 1510 may read data and parity bits from the memory array based on the read command. The parity bits may include a first set of parity bits and a second set of parity bits that correspond to parity information for a respective first subset of the data and a respective second subset of the data. Each of the first subsets of data may overlap with at least one of the second subsets for at least one bit of the data. In some cases, the first subset of parity bits may be associated with a first dimension of a matrix of the data and the second subset of parity bits may be associated with a second dimension of the matrix of the data. In one example, the first dimension of the matrix may correspond to a width of a bus between the memory device 1510 and the host device 1505 and the second dimension of the matrix may correspond to a burst length associated with the read command.

At 1520, the memory device 1510 may read a third set of parity bits from the memory array based on the read command. In a first case, the second set of parity bits may correspond to parity information for the second dimension for a first portion of the data and the third set of parity bits may correspond to parity information for the second dimension for a second portion of the data that is different than the first portion of the data. For example, the data may include two data words (e.g., two (2) 128-bit data words). The second and third set of parity bits may each correspond to a same dimension of the matrix of data. The second set of parity bits may correspond to parity information for the first 128-bit data word while the third set of parity bits corresponds to parity information for the second 128-bit data word. In a second case, the third set of parity bits may correspond to parity information for a third dimension of the matrix of the data.

At 1525, the memory device 1510 may perform an error detection operation on the data read from the memory array based on the first set of parity bits and the second set of parity bits. Performing the error detection operation may include obtaining second data based on the data read from the memory array and the first and second sets of parity bits. In some cases, performing the error detection operation may be based on the third set of parity bits.

At 1530, the memory device 1510 may output an indicator of an error to the host device 1505 based on performing the error detection operation. In some cases, the memory device 1510 may output the second data (e.g., obtained by performing the error detection operation at 1525) to the host device 1505. In some other cases, the memory device 1510 may determine that the memory device 1510 is operating in a first mode, where the first mode is associated with a lower latency than a second mode. The memory device 1510 may output the data read from the memory array to the host device 1505 based on the determining, where outputting the data includes bypassing the error correction operation. In some instances, the memory device 1510 may output the data read from the memory array to the host device 1505 concurrently with performing the error detection operation.

Figure 16:
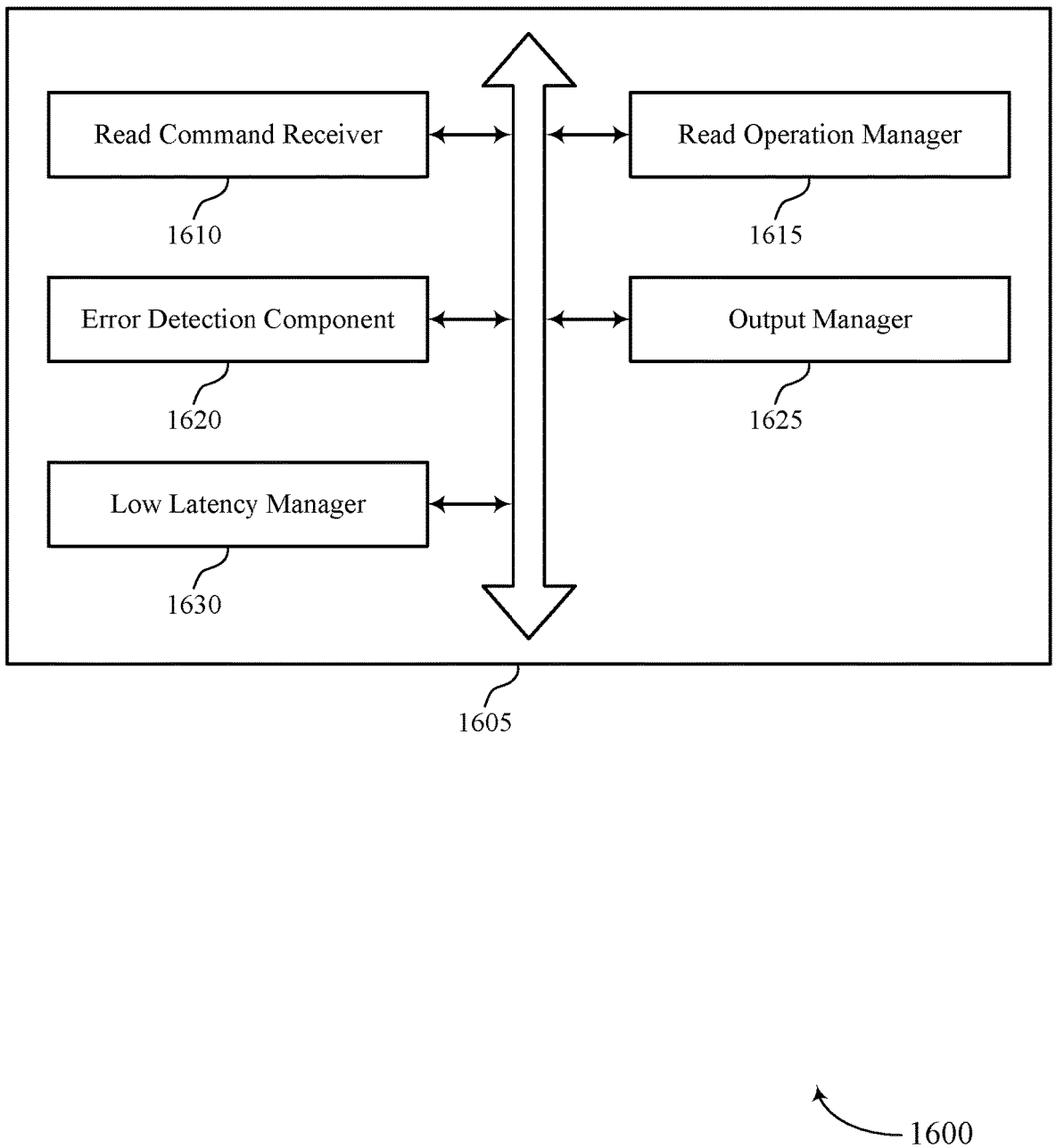
FIG. 16 shows a block diagram of a memory device that supports extended error detection for a memory device in accordance with examples as disclosed herein.

FIG. 16 shows a block diagram 1600 of a memory device 1605 that supports extended error detection in accordance with examples as disclosed herein. The memory device 1605 may be an example of aspects of a memory device as described with reference to FIGS. 1, 3, and 15. The memory device 1605 may include a read command receiver 1610, a read operation manager 1615, an error detection component 1620, an output manager 1625, and a low latency manager 1630. Each of these modules may communicate, directly or indirectly, with one another (e.g., via one or more buses).

The read command receiver 1610 may receive, at a memory device including a memory array, a read command from a host device.

The read operation manager 1615 may read data and a first set of parity bits and a second set of parity bits from the memory array based on the read command. In some cases, each parity bit of the first set correspond to parity information for a respective first subset of the data and each parity bit of the second set correspond to parity information for a respective second subset of the data. Each of the respective first subsets may overlap with at least one of the respective second subsets for at least one bit of the data. In some cases, the respective first subsets are associated with a first dimension of a matrix of the data and the respective second subsets are associated with a second dimension of the matrix of the data. In some instances, the first dimension of the matrix of the data is a multiple of a width of a bus between the memory device and the host device. In some cases, the second dimension of the matrix of the data is a multiple of a burst length associated with the read command.

In some examples, the read operation manager 1615 reads a third set of parity bits from the memory array based on the read command. In a first case, the second set of parity bits corresponds to parity information for the second dimension for a first portion of the data and the third set of parity bits corresponds to parity information for the second dimension for a second portion of the data that is different than the first portion of the data. In a second case, the third set of parity bits corresponds to parity information for a third dimension of the matrix of the data.

The error detection component 1620 may perform an error detection operation on the data read from the memory array based on the first set of parity bits and the second set of parity bits. In some cases, performing the error detection operation includes obtaining second data based on the data read from the memory array and the first and second sets of parity bits. Here, the error detection component 1620 may output the second data to the host device. In some examples, the error detection operation is based on the third set of parity bits. In some cases, the error detection component 1620 may perform at least one of a SEC operation or a SECDED operation on the data read from the memory array to obtain second data.

The output manager 1625 may output an indicator of an error to the host device based on performing the error detection operation. In some cases, the indicator of the error includes an indication of an error impacting a single bit, two bits, three bits, four bits, five bits, an even quantity of bits, or an odd quantity of bits, or a combination thereof. In some examples, the output manager 1625 outputs the data read from the memory array concurrently with performing the error detection operation. In some cases, the output manager 1625 may output the second data to the host device.

The low latency manager 1630 may determine that the memory device is operating in a first mode, where the first mode is associated with a lower latency than a second mode. In some cases, the output manager 1625 may output the data read from the memory array to the host device based on the low latency manager 1630 determining that the memory device is operating in the first mode. Here, the outputting may include bypassing an error correction operation.

Figure 17:
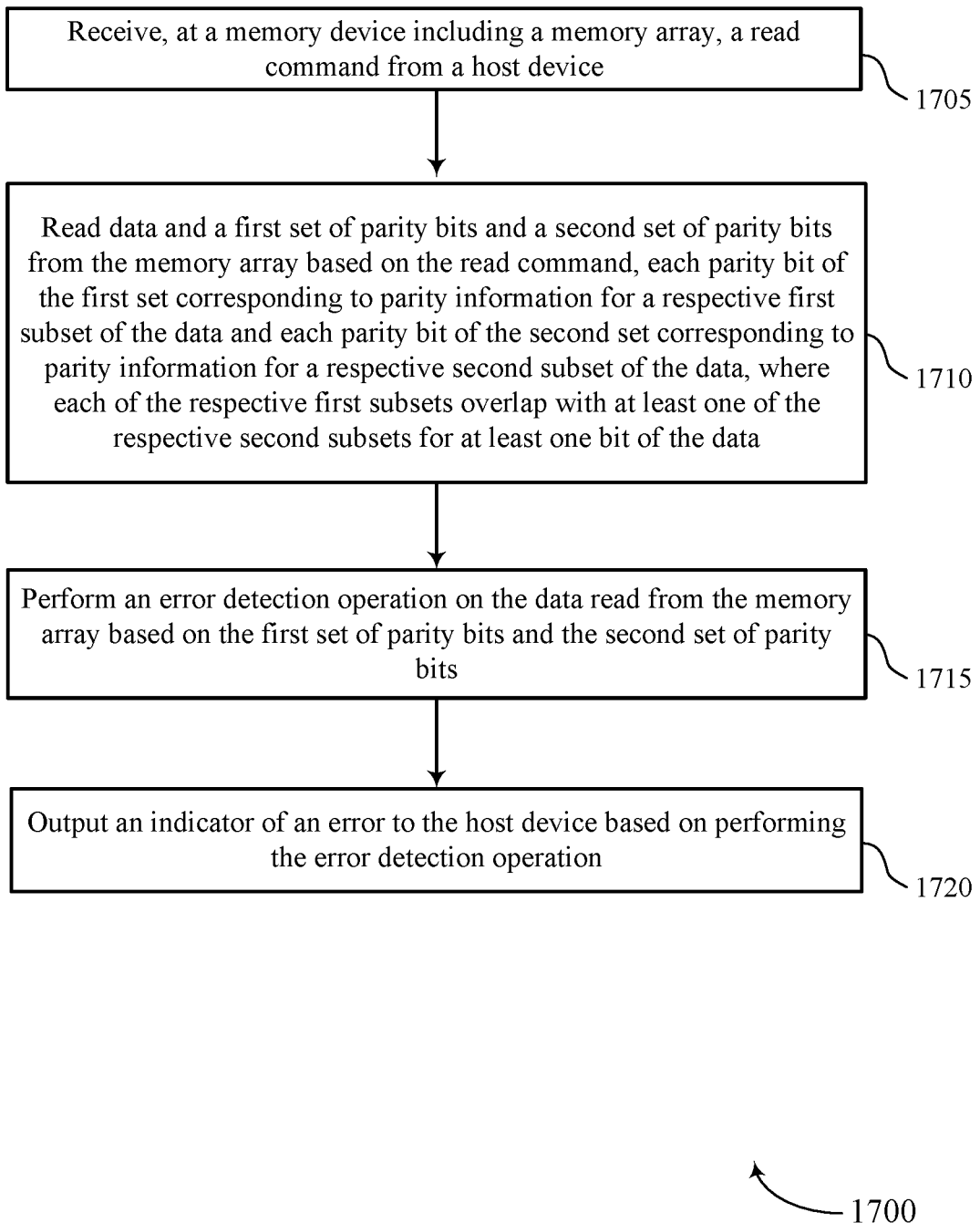
FIGS. 17 and 18 show flowcharts illustrating a method or methods for extended error detection for a memory device in accordance with examples as disclosed herein.

FIG. 17 shows a flowchart illustrating a method or methods 1700 that supports extended error detection for a memory device in accordance with examples as disclosed herein. The operations of method 1700 may be implemented by a memory device or its components as described herein. For example, the operations of method 1700 may be performed by a memory device as described with reference to FIG. 16. In some examples, a memory device executes a set of instructions to control the functional elements of the memory device to perform the described functions. Additionally or alternatively, a memory device may perform aspects of the described functions using special-purpose hardware.

At 1705, the memory device including a memory array may receive a read command from a host device. The operations of 1705 may be performed according to the methods described herein. In some examples, aspects of the operations of 1705 may be performed by a read command receiver as described with reference to FIG. 16.

At 1710, the memory device may read data and a first set of parity bits and a second set of parity bits from the memory array based on the read command. Each parity bit of the first set may correspond to parity information for a respective first subset of the data and each parity bit of the second set may correspond to parity information for a respective second subset of the data. Each of the respective first subsets may overlap with at least one of the respective second subsets for at least one bit of the data. The operations of 1710 may be performed according to the methods described herein. In some examples, aspects of the operations of 1710 may be performed by a read operation manager as described with reference to FIG. 16.

At 1715, the memory device may perform an error detection operation on the data read from the memory array based on the first set of parity bits and the second set of parity bits. The operations of 1715 may be performed according to the methods described herein. In some examples, aspects of the operations of 1715 may be performed by an error detection component as described with reference to FIG. 16.

At 1720, the memory device may output an indicator of an error to the host device based on performing the error detection operation. The operations of 1720 may be performed according to the methods described herein. In some examples, aspects of the operations of 1720 may be performed by an output manager as described with reference to FIG. 16.

In some examples, an apparatus as described herein may perform a method or methods, such as the method 1700. The apparatus may include features, means, or instructions (e.g., a non-transitory computer-readable medium storing instructions executable by a processor) for receiving, at a memory device including a memory array, a read command from a host device, reading data and a first set of parity bits and a second set of parity bits from the memory array based on the read command, each parity bit of the first set corresponding to parity information for a respective first subset of the data and each parity bit of the second set corresponding to parity information for a respective second subset of the data, where each of the respective first subsets overlap with at least one of the respective second subsets for at least one bit of the data, performing an error detection operation on the data read from the memory array based on the first set of parity bits and the second set of parity bits, and outputting an indicator of an error to the host device based on performing the error detection operation.

In some examples of the method 1700 and the apparatus described herein, the respective first subsets may be associated with a first dimension of a matrix of the data and the respective second subsets may be associated with a second dimension of the matrix of the data.

In some cases of the method 1700 and the apparatus described herein, the first dimension of the matrix of the data is a multiple of a width of a bus between the memory device and the host device, and the second dimension of the matrix of the data is a multiple of a burst length associated with the read command.

Some instances of the method 1700 and the apparatus described herein may further include operations, features, means, or instructions for reading a third set of parity bits from the memory array based on the read command, where the second set of parity bits corresponds to parity information for the second dimension for a first portion of the data and the third set of parity bits corresponds to parity information for the second dimension for a second portion of the data that may be different than the first portion of the data.

Some examples of the method 1700 and the apparatus described herein may further include operations, features, means, or instructions for reading a third set of parity bits from the memory array based on the read command, the third set of parity bits corresponding to parity information for a third dimension of the matrix of the data, and where the performing the error detection operation may be based on the third set of parity bits.

In some cases of the method 1700 and the apparatus described herein, performing the error detection operation may include operations, features, means, or instructions for obtaining second data based on the data read from the memory array and the first and second sets of parity bits, the method further including outputting the second data to the host device.

Some instances of the method 1700 and the apparatus described herein may further include operations, features, means, or instructions for determining that the memory device may be operating in a first mode, where the first mode may be associated with a lower latency than a second mode, and outputting the data read from the memory array to the host device based on the determining, where the outputting includes bypassing an error correction operation.

Some examples of the method 1700 and the apparatus described herein may further include operations, features, means, or instructions for outputting the data read from the memory array concurrently with performing the error detection operation.

Some cases of the method 1700 and the apparatus described herein may further include operations, features, means, or instructions for performing at least one of a SEC operation or a SECDED operation on the data read from the memory array to obtain second data, and outputting the second data to the host device.

In some examples of the method 1700 and the apparatus described herein, the indicator of the error includes an indication of an error impacting a single bit, two bits, three bits, four bits, five bits, an even quantity of bits, or an odd quantity of bits, or a combination thereof.

In some examples, an apparatus that supports extended error detection for a memory device may perform aspects of the functions described herein using general- or special-purpose hardware. The apparatus may include an array of memory cells, each memory cell including a capacitive storage element, an interface couplable with a host device via a channel, a controller configured to receive a read command from the host device via the interface and to read data from the array of memory cells, and error detection logic coupled with the interface and the array of memory cells and configured to perform an error detection operation based on a first set of parity bits and a second set of parity bits. Each parity bit of the first set may correspond to parity information for a respective first subset of the data and each parity bit of the second set may correspond to parity information for a respective second subset of the data, where each of the respective first subsets may overlap with at least one of the respective second subsets for at least one bit of the data.

In some cases, the error detection logic is further configured to detect whether the data includes an error based on performing the error detection operation, and the controller is further configured to set a value of a register indicating whether the data includes the error.

In some instances, the respective first subsets are associated with a first dimension of a matrix of the data and the respective second subsets are associated with a second dimension of the matrix of the data.

In some examples, the first dimension of the matrix of the data corresponds to a width of the channel, and the second dimension of the matrix of the data corresponds to a burst length associated with the read command.

In some cases, the error detection logic is further configured to obtain second data based on the data and the first and second sets of parity bits, and the interface is configured to output the second data to the host device.

In some instances, the error detection logic is configured to identify that the error detection logic is operating in a first mode, the first mode being associated with a lower latency than a second mode, and the interface is configured to output the data read from the array of memory cells via a data path that bypasses the error detection logic based on the identifying that the error detection logic is operating in the first mode.

Figure 18:
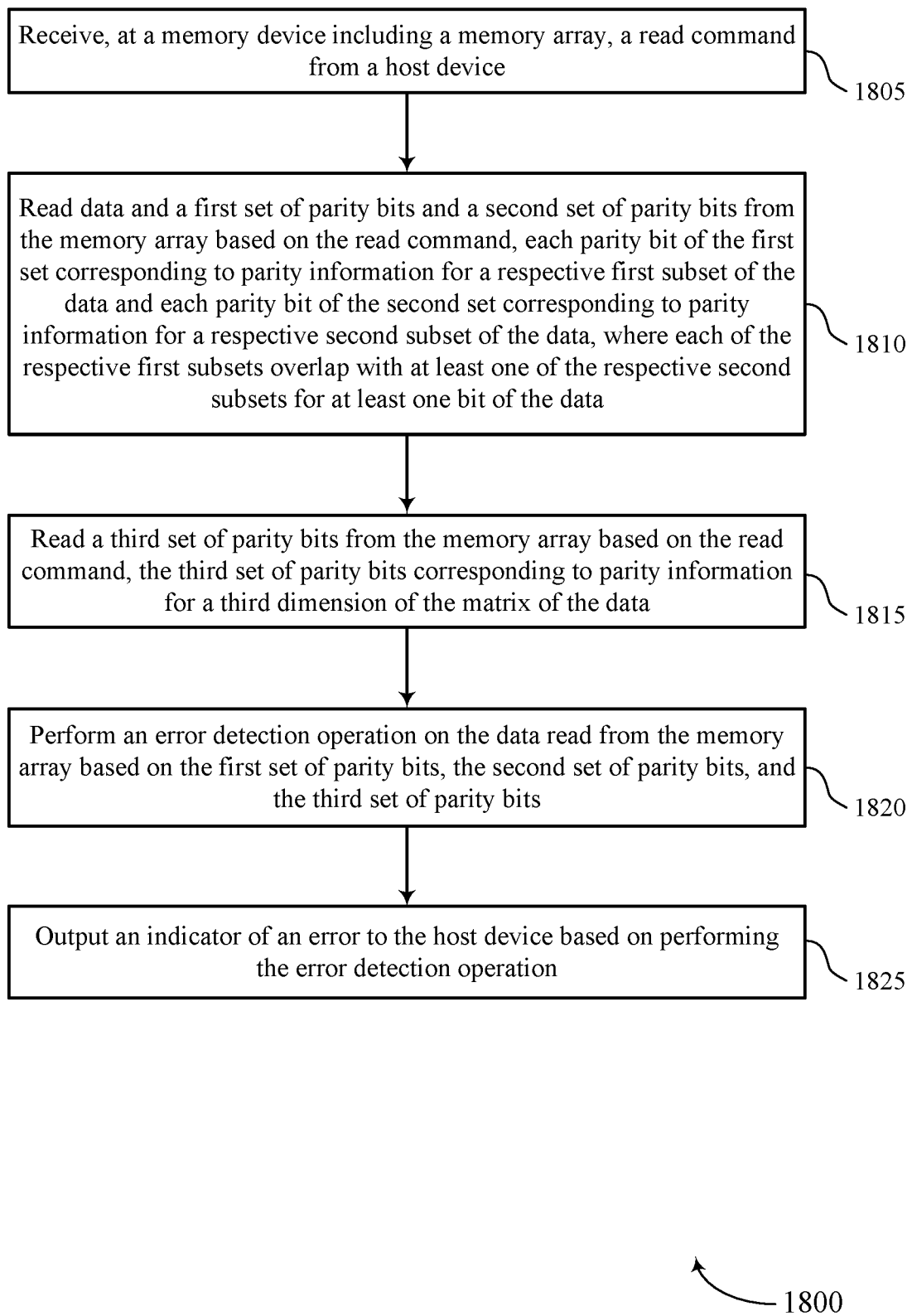

FIG. 18 shows a flowchart illustrating a method or methods 1800 that supports extended error detection for a memory device in accordance with examples as disclosed herein. The operations of method 1800 may be implemented by a memory device or its components as described herein. For example, the operations of method 1800 may be performed by a memory device as described with reference to FIG. 16. In some examples, a memory device may execute a set of instructions to control the functional elements of the memory device to perform the described functions. Additionally or alternatively, a memory device may perform aspects of the described functions using special-purpose hardware.

At 1805, the memory device including a memory array may receive a read command from a host device. The operations of 1805 may be performed according to the methods described herein. In some examples, aspects of the operations of 1805 may be performed by a read command receiver as described with reference to FIG. 16.

At 1810, the memory device may read data and a first set of parity bits and a second set of parity bits from the memory array based on the read command. Each parity bit of the first set may correspond to parity information for a respective first subset of the data and each parity bit of the second set may correspond to parity information for a respective second subset of the data. Each of the respective first subsets may overlap with at least one of the respective second subsets for at least one bit of the data. The operations of 1810 may be performed according to the methods described herein. In some examples, aspects of the operations of 1810 may be performed by a read operation manager as described with reference to FIG. 16.

At 1815, the memory device may read a third set of parity bits from the memory array based on the read command, the third set of parity bits corresponding to parity information for a third dimension of the matrix of the data. The operations of 1815 may be performed according to the methods described herein. In some examples, aspects of the operations of 1815 may be performed by a read operation manager as described with reference to FIG. 16.

At 1820, the memory device may perform an error detection operation on the data read from the memory array based on the first set of parity bits, the second set of parity bits, and the third set of parity bits. The operations of 1820 may be performed according to the methods described herein. In some examples, aspects of the operations of 1820 may be performed by an error detection component as described with reference to FIG. 16.

At 1825, the memory device may output an indicator of an error to the host device based on performing the error detection operation. The operations of 1825 may be performed according to the methods described herein. In some examples, aspects of the operations of 1825 may be performed by an output manager as described with reference to FIG. 16.

It should be noted that the methods described above describe possible implementations, and that the operations and the steps may be rearranged or otherwise modified and that other implementations are possible. Furthermore, aspects from two or more of the methods may be combined.

In some examples, an apparatus that supports extended error detection for a memory device may perform aspects of the functions described herein using general- or special-purpose hardware. The apparatus may include an array of memory cells, each memory cell including a capacitive storage element, an interface couplable with a host device via a channel, a controller configured to receive a write command from the host device via the interface and to write data to the array of memory cells, and error detection logic coupled with the interface and the array of memory cells and configured to generate a first set of parity bits and a second set of parity bits. Each parity bit of the first set may correspond to parity information for a respective first subset of the data and each parity bit of the second set may correspond to parity information for a respective second subset of the data. Each of the respective first subsets may overlap with at least one of the respective second subsets for at least one bit of the data, and the array of memory cells may be further configured to store the data, the first set of parity bits, and the second set of parity bits.

In some cases, the respective first subsets are associated with a first dimension of a matrix of the data and the respective second subsets are associated with a second dimension of the matrix of the data.

In some instances, the first dimension of the matrix of the data corresponds to a width of the channel, and the second dimension corresponds to a burst length associated with the write command.

In some examples, the error detection logic is further configured to generate a third set of parity bits. The second set of parity bits may correspond to parity information for the second dimension for a first portion of the data and the third set of parity bits may correspond to parity information for the second dimension for a second portion of the data that is different than the first portion of the data. The array of memory cells may be configured to store, based on the write command, the third set of parity bits.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," "coupled," and "couplable" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow. The term "couplable" refers to a component that is configured for coupling with another component to provide the closed-circuit relationship capable of communicating signals between the components over conductive paths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving, at a memory device via an interface, a write command comprising data to be written to one or more memory cells of the memory device;
generating, based at least in part on receiving the write command, error information comprising a first set of parity bits corresponding to a first subset of the data and a second set of parity bits corresponding to a second subset of the data;
storing, to the one or more memory cells of the memory device, the first set of parity bits and the second set of parity bits based at least in part on generating the error information;
receiving, at the memory device, a read command for the data based at least in part on generating the error information; and
performing an error detection operation based at least in part on receiving the read command, wherein the error detection operation comprises comparing two or more of the first set of parity bits, the second set of parity bits, or a third set of parity bits.

2. The method of claim 1, wherein the first set of parity bits, the second set of parity bits, and the data are stored to a same sub-array or a same row of the memory device.

3. The method of claim 1, further comprising:
reading the data from the one or more memory cells of the memory device based at least in part on receiving the read command; and
reading the first set of parity bits and the second set of parity bits from the one or more memory cells of the memory device based at least in part on reading the data, wherein performing the error detection operation is based at least in part on reading the data from the one or more memory cells of the memory device and reading the first set of parity bits and the second set of parity bits from the one or more memory cells of the memory device.

4. The method of claim 3, wherein performing the error detection operation comprises:
generating the third set of parity bits based at least in part on reading the data from the one or more memory cells of the memory device; and
comparing two or more of the first set of parity bits, the second set of parity bits, and the third set of parity bits based at least in part on generating the third set of parity bits.

5. The method of claim 1, further comprising:
transmitting second data, wherein at least a portion of the second data is transmitted concurrent with performing the error detection operation; and
transmitting an indication of an error associated with the data from the one or more memory cells of the memory device based at least in part on performing the error detection operation.

6. The method of claim 5, further comprising:
detecting the error associated with the data from the one or more memory cells from the memory device while at least a portion of the second data is being transmitted, wherein the indication of the error associated with the data is transmitted after the second data is transmitted.

7. A method, comprising:
receiving, at a memory device via an interface, a write command comprising data to be written to one or more memory cells of the memory device;
generating, based at least in part on receiving the write command, error information comprising a first set of parity bits corresponding to a first subset of the data and a second set of parity bits corresponding to a second subset of the data;
receiving, at the memory device, a read command for the data based at least in part on generating the error information;
performing an error detection operation based at least in part on receiving the read command, wherein the error detection operation comprises comparing two or more of the first set of parity bits, the second set of parity bits, or a third set of parity bits;
correcting at least one error associated with the data based at least in part on performing the error detection operation, wherein the at least one error comprises a single-bit error, a double-bit error, or an error associated with more than two bits; and
transmitting the corrected data based at least in part on correcting the at least one error associated with the data.

8. A method, comprising:
generating, at a memory device, a first set of parity bits based at least in part on receiving a write command comprising data to be written to a sub-array of the memory device;
storing the first set of parity bits to the sub-array of the memory device based at least in part on generating the first set of parity bits;
receiving a read command for the data stored to the sub-array of the memory device;
generating a second set of parity bits based at least in part on receiving the read command for the data stored to the sub-array of the memory device; and
performing an error detection operation based at least in part on receiving the read command, wherein the error detection operation comprises comparing the first set of parity bits with the second set of parity bits based at least in part on generating the second set of parity bits, wherein the data stored to the sub-array of the memory device comprises an error based at least in part on one bit of the first set of parity bits being different than a corresponding bit of the second set of parity bits.

9. The method of claim 8, further comprising:
reading the first set of parity bits from the sub-array of the memory device; and
determining that each parity bit of the first set of parity bits matches each corresponding bit of the second set of parity bits.

10. A method, comprising:
generating, at a memory device, a first set of parity bits based at least in part on receiving a write command comprising data to be written to a sub-array of the memory device;
storing the first set of parity bits to the sub-array of the memory device based at least in part on generating the first set of parity bits;
receiving a read command for the data stored to the sub-array of the memory device;
reading the first set of parity bits from the sub-array of the memory device;
generating a second set of parity bits based at least in part on receiving the read command for the data stored to the sub-array of the memory device; and
performing an error detection operation based at least in part on receiving the read command, wherein the error detection operation comprises determining that at least one bit of the first set of parity bits is different than a corresponding bit of the second set of parity bits.

11. The method of claim 10, further comprising:
correcting an error associated with the data stored to the sub-array of the memory device based at least in part on determining that at least one bit of the first set of parity bits is different than a corresponding bit of the second set of parity bits; and
transmitting the corrected data based at least in part on correcting the error.

12. An apparatus, comprising:
a memory array comprising a plurality of memory cells; and
a controller coupled with an array of memory cells and configured to:
receive a command;
read data, a first set of parity bits, and a second set of parity bits from the memory array based at least in part on receiving the command, each parity bit of the first set of parity bits corresponding to parity information for a respective first subset of the data and each parity bit of the second set of parity bits corresponding to parity information for a respective second subset of the data, wherein the respective first subsets are associated with a first dimension of a matrix of the data and the respective second subsets are associated with a second dimension of the matrix of the data;
perform an error detection operation on the data read from the memory array based at least in part on the first set of parity bits and the second set of parity bits; and
output an indicator of an error based at least in part on performing the error detection operation.

13. The apparatus of claim 12, wherein the controller is configured to:
read a third set of parity bits from the memory array based at least in part on receiving the command, wherein the second set of parity bits corresponds to parity information for the second dimension for a first portion of the data and the third set of parity bits corresponds to parity information for the second dimension for a second portion of the data that is different than the first portion of the data.

14. The apparatus of claim 12, wherein the controller is configured to:
read a third set of parity bits from the memory array based at least in part on the command, the third set of parity bits corresponding to parity information for a third dimension of the matrix of the data,
wherein the performing the error detection operation is based at least in part on the third set of parity bits.

15. An apparatus comprising:
a memory array comprising a plurality of memory cells; and
a controller coupled with an array of memory cells and configured to:
receive a command;
read data, a first set of parity bits, and a second set of parity bits from the memory array based at least in part on receiving the command, each parity bit of the first set of parity bits corresponding to parity information for a respective first subset of the data and each parity bit of the second set of parity bits corresponding to parity information for a respective second subset of the data;
perform an error detection operation on the data read from the memory array based at least in part on the first set of parity bits and the second set of parity bits;
obtain second data based at least in part on the data read from the memory array and the first set of parity bits and the second set of parity bits; and
output the second data and an indicator of an error based at least in part on performing the error detection operation.

16. The apparatus of claim 12, wherein the controller is configured to:
determine that the memory array is operating in a first mode, wherein the first mode is associated with a lower latency than a second mode; and
output the data read from the memory array based at least in part on the determining, wherein the outputting comprises bypassing an error correction operation.

17. The apparatus of claim 12, wherein the controller is configured to:
perform at least one of a single error correction (SEC) operation or a single error correction double error detection (SECDED) operation on the data read from the memory array to obtain second data; and
output the second data.

* * * * *